United States Patent
Cheng et al.

(10) Patent No.: US 10,867,955 B2
(45) Date of Patent: Dec. 15, 2020

(54) PACKAGE STRUCTURE HAVING ADHESIVE LAYER SURROUNDED DAM STRUCTURE

(71) Applicant: Taiwan Semiconductor Manufacturing Co., Ltd., Hsinchu (TW)

(72) Inventors: Li-Hui Cheng, New Taipei (TW); Chin-Fu Kao, Taipei (TW); Chih-Yuan Chien, Hsinchu County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/252,724

(22) Filed: Jan. 21, 2019

(65) Prior Publication Data
US 2020/0105705 A1    Apr. 2, 2020

Related U.S. Application Data

(60) Provisional application No. 62/737,130, filed on Sep. 27, 2018.

(51) Int. Cl.
  *H01L 25/065*  (2006.01)
  *H01L 25/07*   (2006.01)
  (Continued)

(52) U.S. Cl.
  CPC .............. *H01L 24/32* (2013.01); *H01L 24/02* (2013.01); *H01L 24/13* (2013.01); *H01L 24/16* (2013.01); *H01L 25/50* (2013.01); *H01L 25/0652* (2013.01); *H01L 25/071* (2013.01); *H01L 25/112* (2013.01); *H01L 2224/02331* (2013.01);
  (Continued)

(58) Field of Classification Search
  CPC ......... H01L 24/32; H01L 24/02; H01L 24/13; H01L 24/16; H01L 25/50; H01L 25/0652; H01L 25/071; H01L 25/112
  See application file for complete search history.

(56) References Cited

U.S. PATENT DOCUMENTS 5,767,447 A * 6/1998 Dudderar ................ H01L 23/04
                                                    174/546
5,855,821 A   1/1999 Chau et al.
  (Continued)

FOREIGN PATENT DOCUMENTS

| KR | 20110033367 | 3/2011 |
|---|---|---|
| TW | 201643996 | 12/2016 |
| WO | 2015174930 | 11/2015 |

OTHER PUBLICATIONS

"Office Action of Taiwan Counterpart Application", dated Mar. 6, 2020, p. 1-p. 4.
  (Continued)

*Primary Examiner* — Ida M Soward
(74) *Attorney, Agent, or Firm* — JCIPRNET

(57) ABSTRACT

A package structure includes a substrate, a die, an adhesive layer, a dam structure, and an encapsulant. The die is disposed on the substrate. The adhesive layer is disposed between the substrate and the die. The adhesive layer has a curved surface. The dam structure is disposed on the substrate and surrounded by the adhesive layer. The encapsulant encapsulates the die.

20 Claims, 20 Drawing Sheets

(51) Int. Cl.
*H01L 25/11* (2006.01)
*H01L 23/00* (2006.01)
*H01L 25/00* (2006.01)

(52) U.S. Cl.
CPC ............ *H01L 2224/02379* (2013.01); *H01L 2224/02381* (2013.01); *H01L 2224/13024* (2013.01); *H01L 2224/16148* (2013.01); *H01L 2224/26145* (2013.01); *H01L 2224/32052* (2013.01); *H01L 2224/32145* (2013.01)

(56) References Cited

U.S. PATENT DOCUMENTS

| | | | | |
|---|---|---|---|---|
| 6,853,089 B2* | 2/2005 | Ujiie | ............... | H01L 21/56 257/782 |
| 6,940,182 B2 | 9/2005 | Hilton et al. | | |
| 7,078,264 B2* | 7/2006 | Yang | ............... | H01L 25/0657 438/108 |
| 7,148,560 B2* | 12/2006 | Lee | ............... | H01L 21/563 257/667 |
| 7,483,276 B2* | 1/2009 | Kim | ............... | H01L 23/24 361/760 |
| 8,993,380 B2 | 3/2015 | Hou et al. | | |
| 9,275,968 B2* | 3/2016 | Jeong | ............... | H01L 23/16 |
| 9,281,254 B2 | 3/2016 | Yu et al. | | |
| 9,299,649 B2 | 3/2016 | Chiu et al. | | |
| 9,372,206 B2 | 6/2016 | Wu et al. | | |
| 9,425,126 B2 | 8/2016 | Kuo et al. | | |
| 9,443,783 B2 | 9/2016 | Lin et al. | | |
| 9,461,018 B1 | 10/2016 | Tsai et al. | | |
| 9,496,189 B2 | 11/2016 | Yu et al. | | |
| 9,666,502 B2 | 5/2017 | Chen et al. | | |
| 9,735,131 B2 | 8/2017 | Su et al. | | |
| 9,870,967 B2* | 1/2018 | Bolognia | ............... | H01L 23/053 |
| 10,515,827 B2* | 12/2019 | Jeng | ............... | H01L 21/486 |
| 2011/0095421 A1* | 4/2011 | Kim | ............... | H01L 24/31 257/737 |
| 2011/0127655 A1* | 6/2011 | Fujii | ............... | H01L 23/04 257/664 |
| 2011/0186973 A1 | 8/2011 | Pagaila | | |
| 2012/0326193 A1* | 12/2012 | Park | ............... | H01L 33/52 257/98 |
| 2016/0262292 A1* | 9/2016 | Kuk | ............... | B05B 15/20 |
| 2017/0194281 A1* | 7/2017 | DeLaCruz | ............... | H01L 24/16 |
| 2018/0323118 A1* | 11/2018 | Wang | ............... | H01L 23/04 |
| 2018/0342466 A1* | 11/2018 | Lin | ............... | H01L 23/562 |

OTHER PUBLICATIONS

"Office Action of Taiwan Counterpart Application", dated Sep. 22, 2020, p. 1-p. 5.

* cited by examiner

PACKAGE STRUCTURE HAVING ADHESIVE LAYER SURROUNDED DAM STRUCTURE

CROSS-REFERENCE TO RELATED APPLICATION

This application claims the priority benefit of U.S. provisional application Ser. No. 62/737,130, filed on Sep. 27, 2018. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
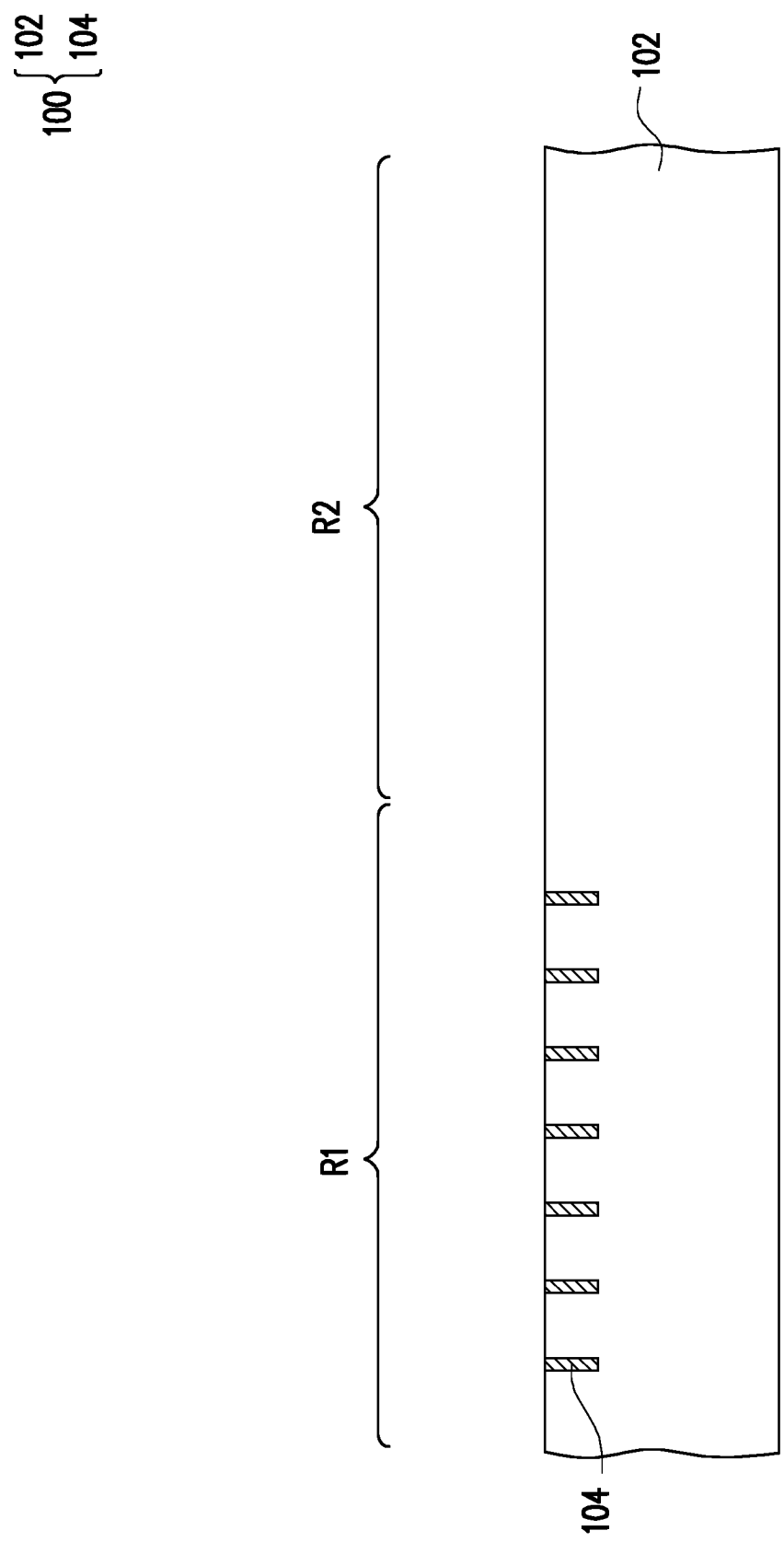
FIG. 1A to FIG. 1P are schematic cross-sectional views illustrating a manufacturing process of a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
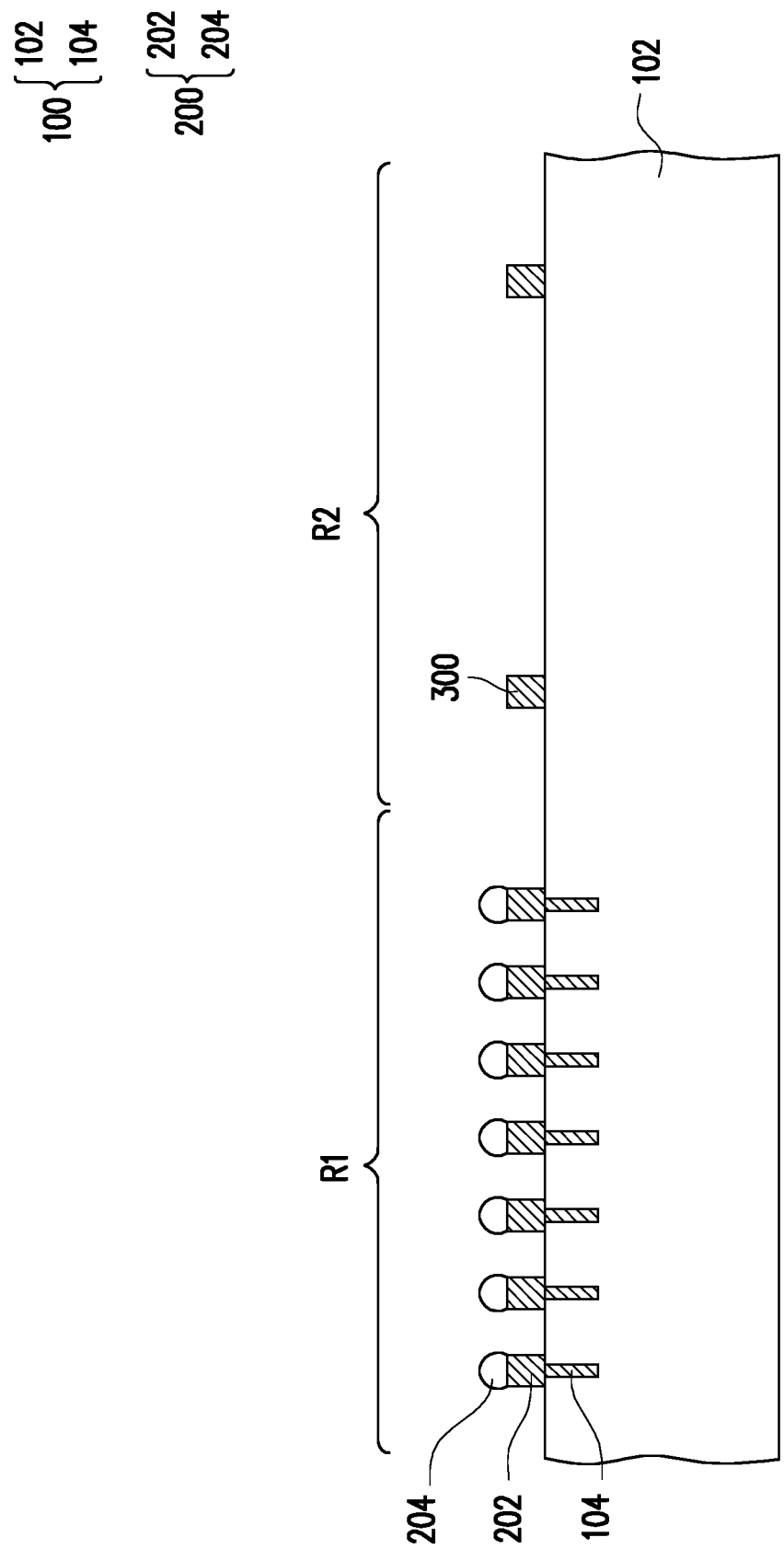
Figure 1C:
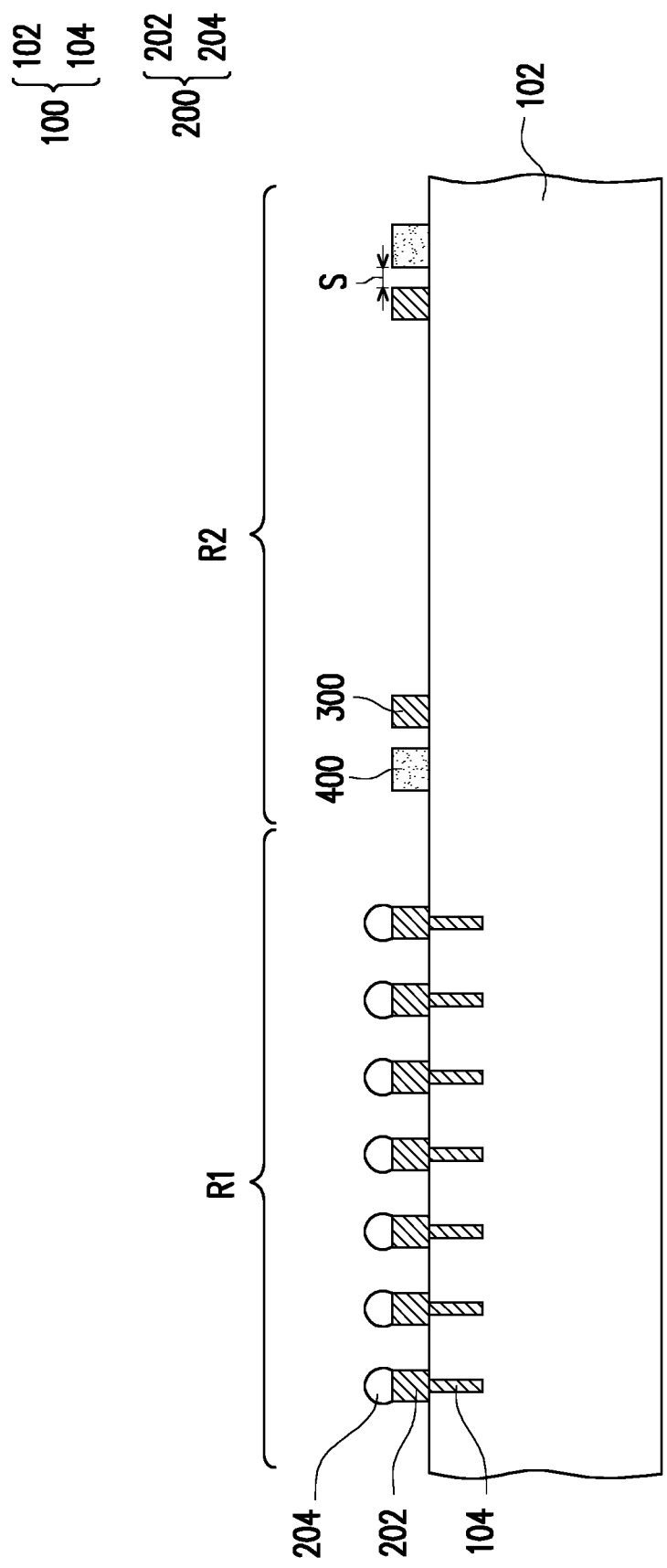
Figure 1D:
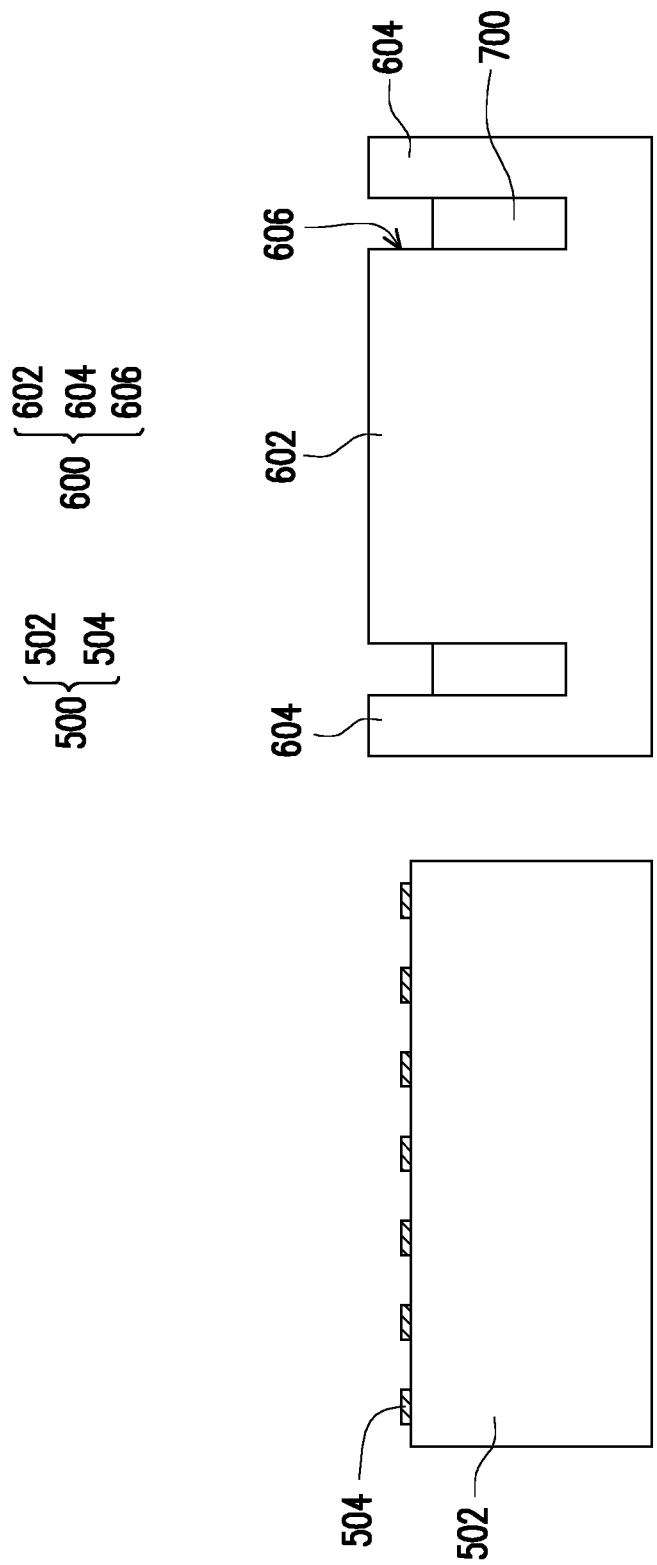
Figure 1E:
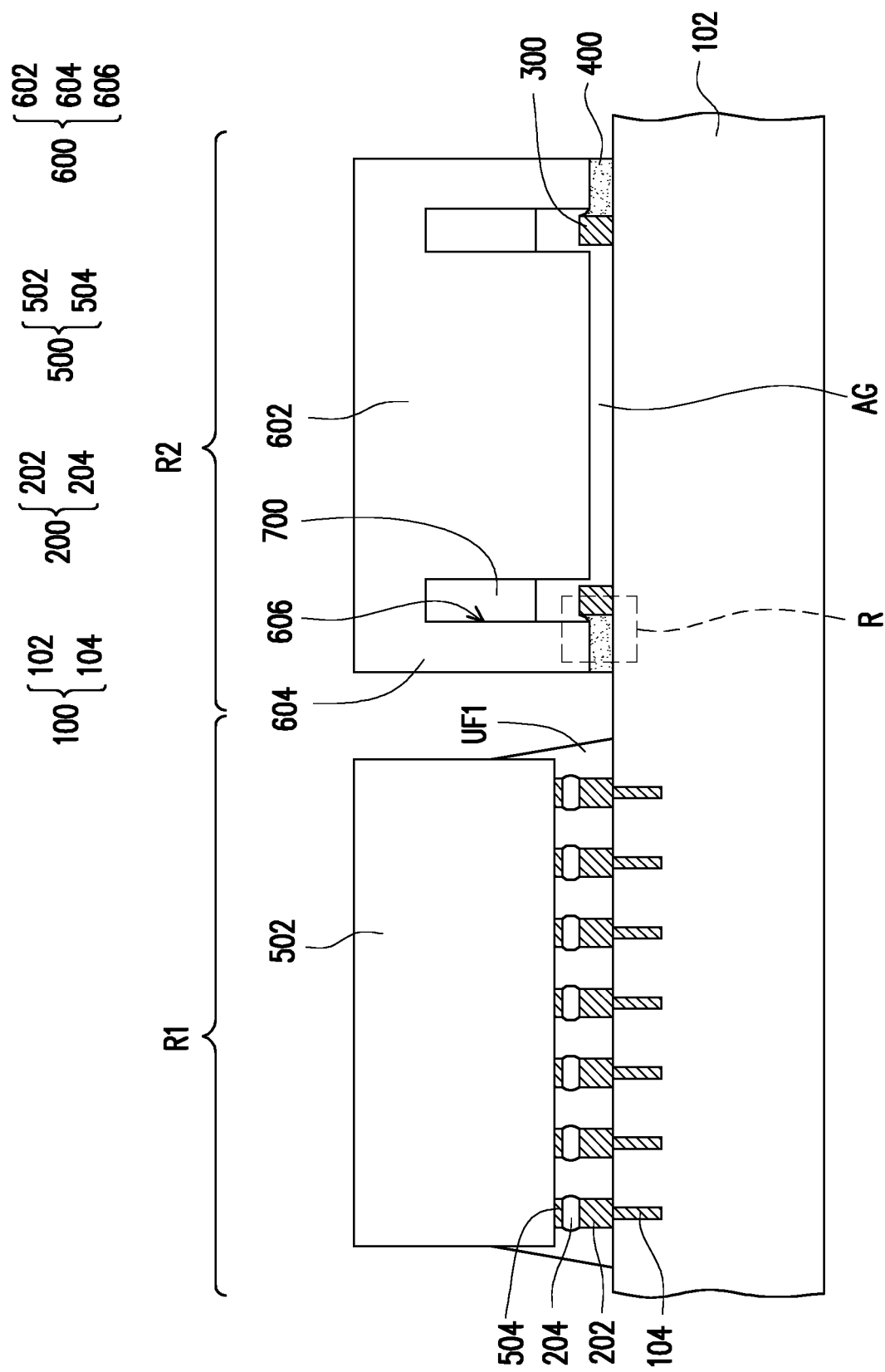
Figure 1F:
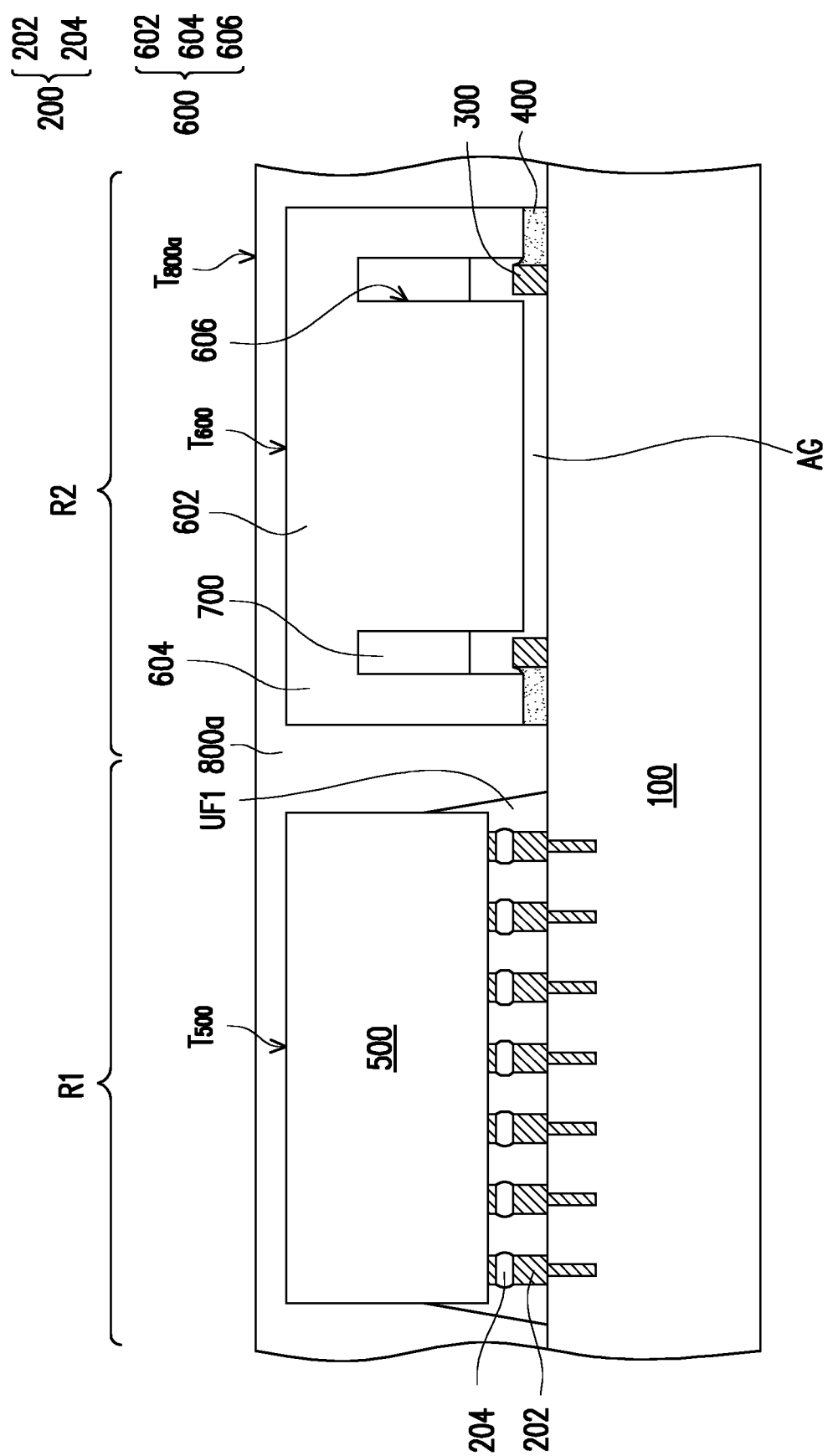
Figure 1G:
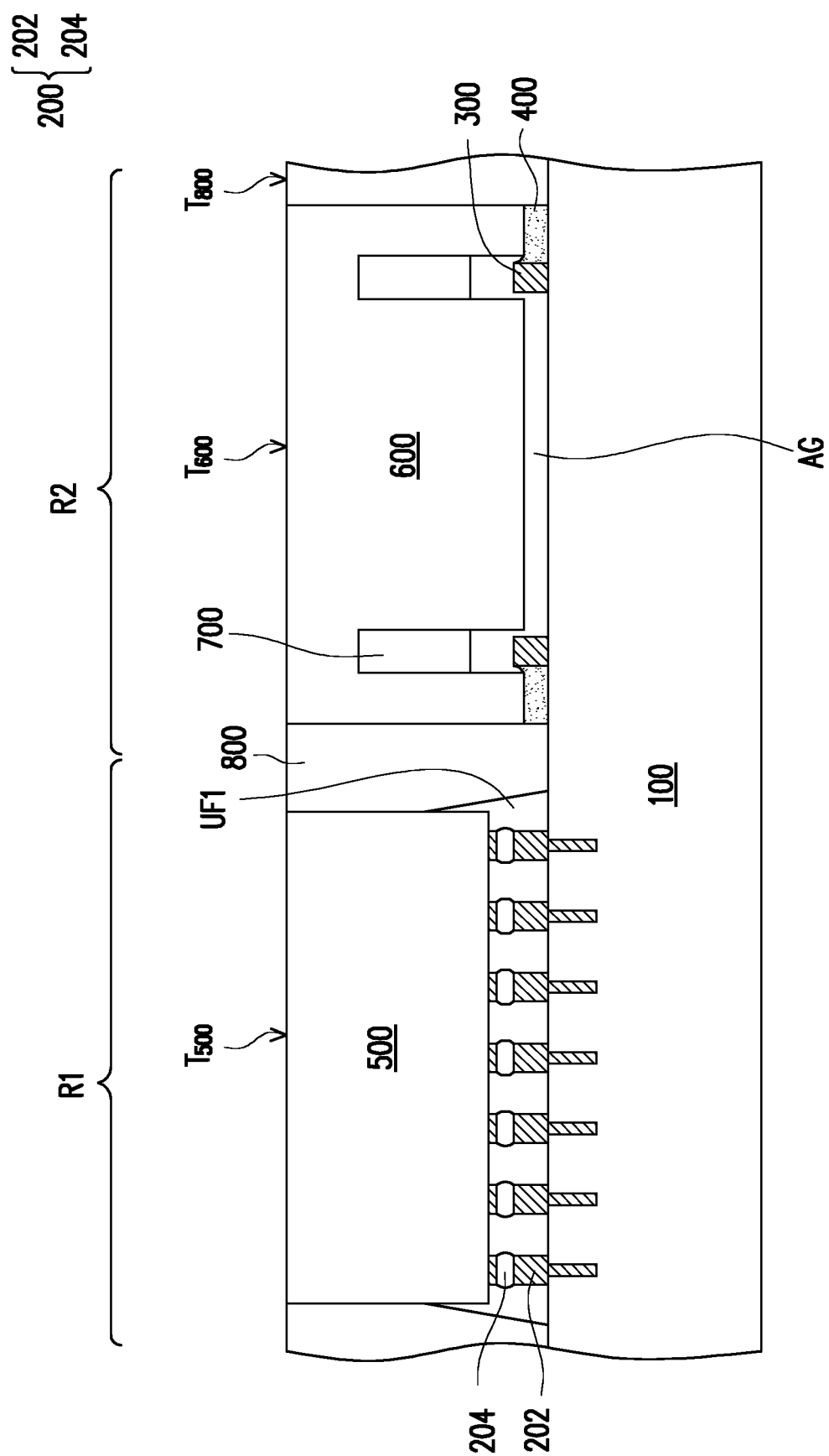
Figure 1H:
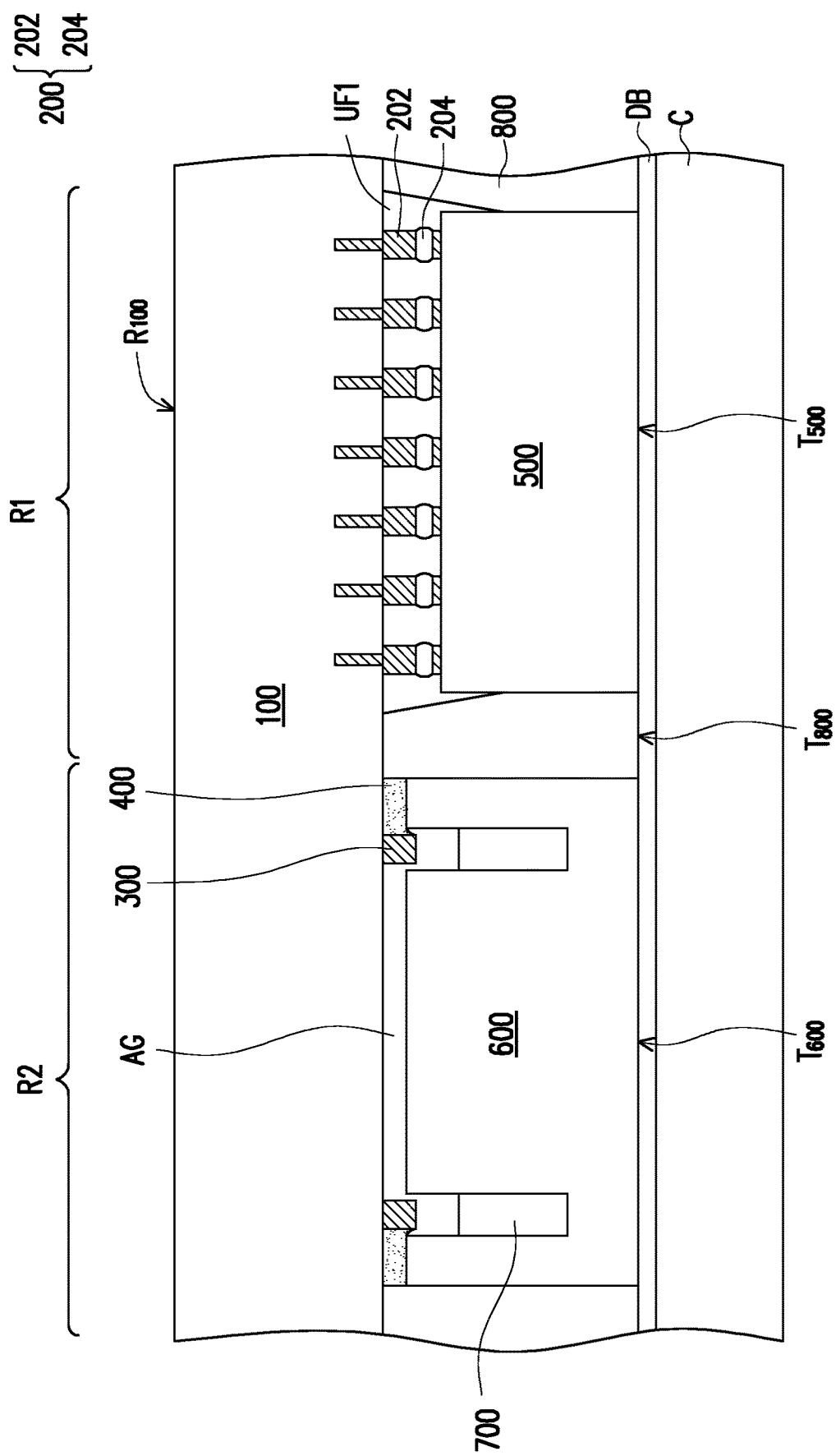
Figure 1I:
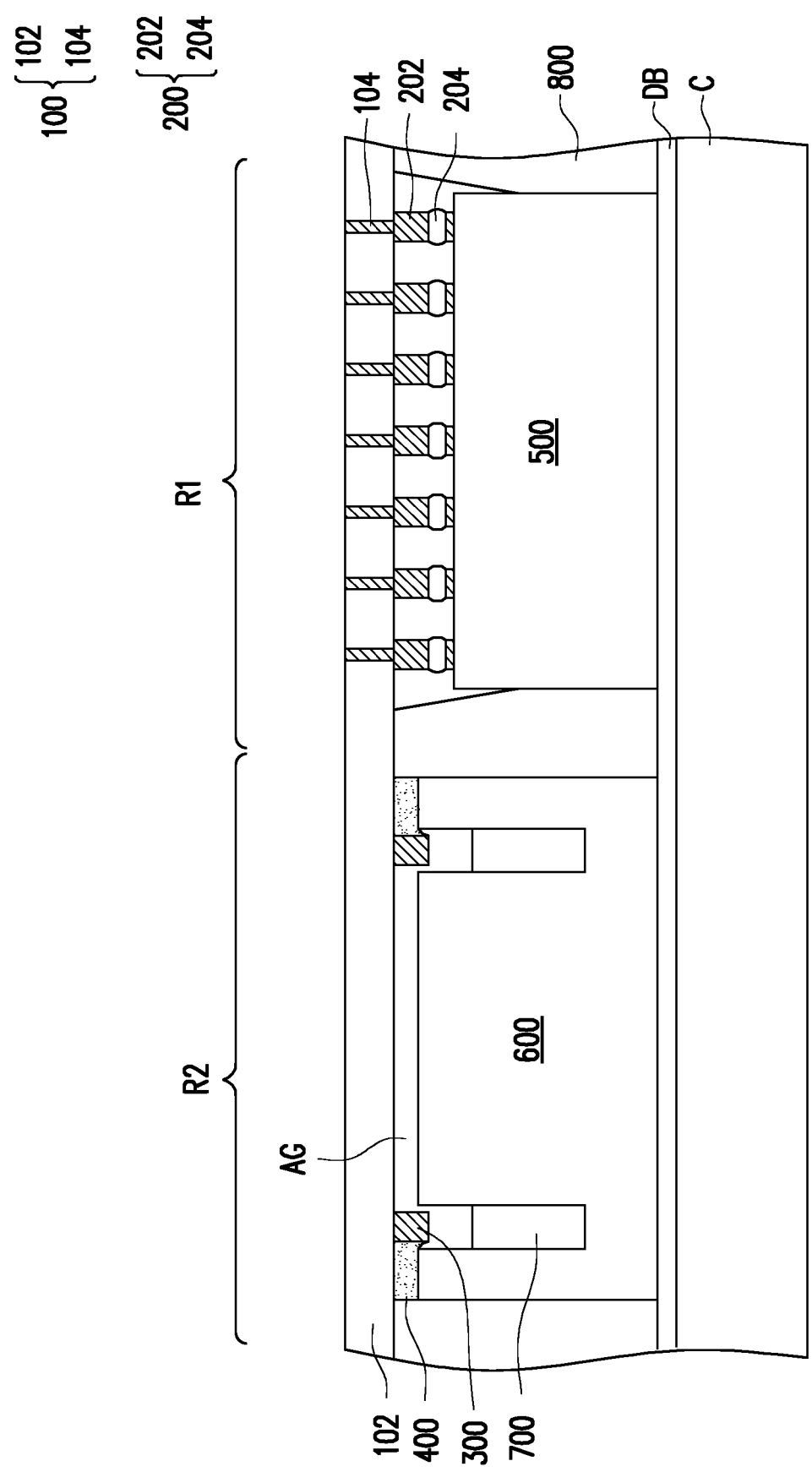
Figure 1J:
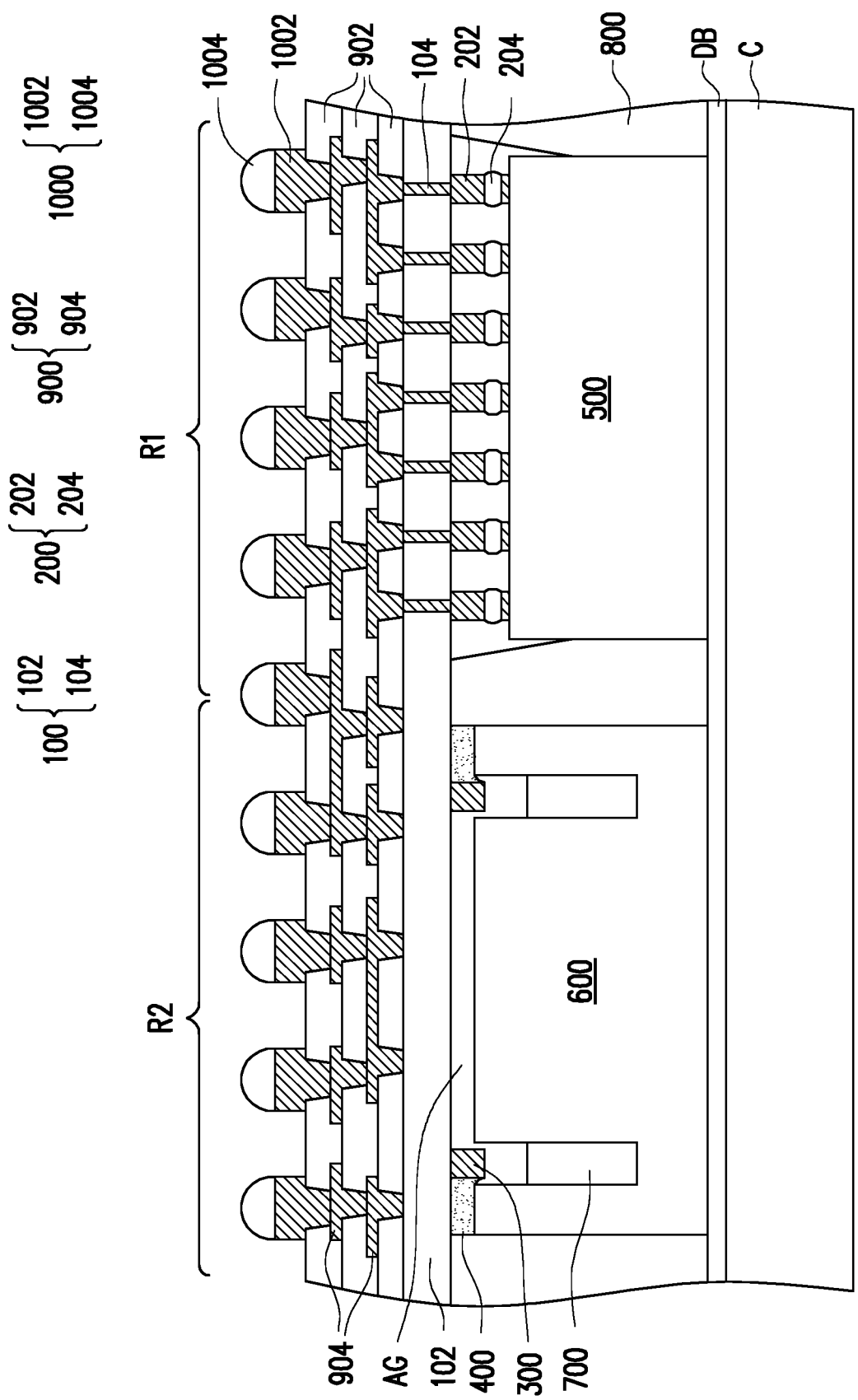
Figure 1K:
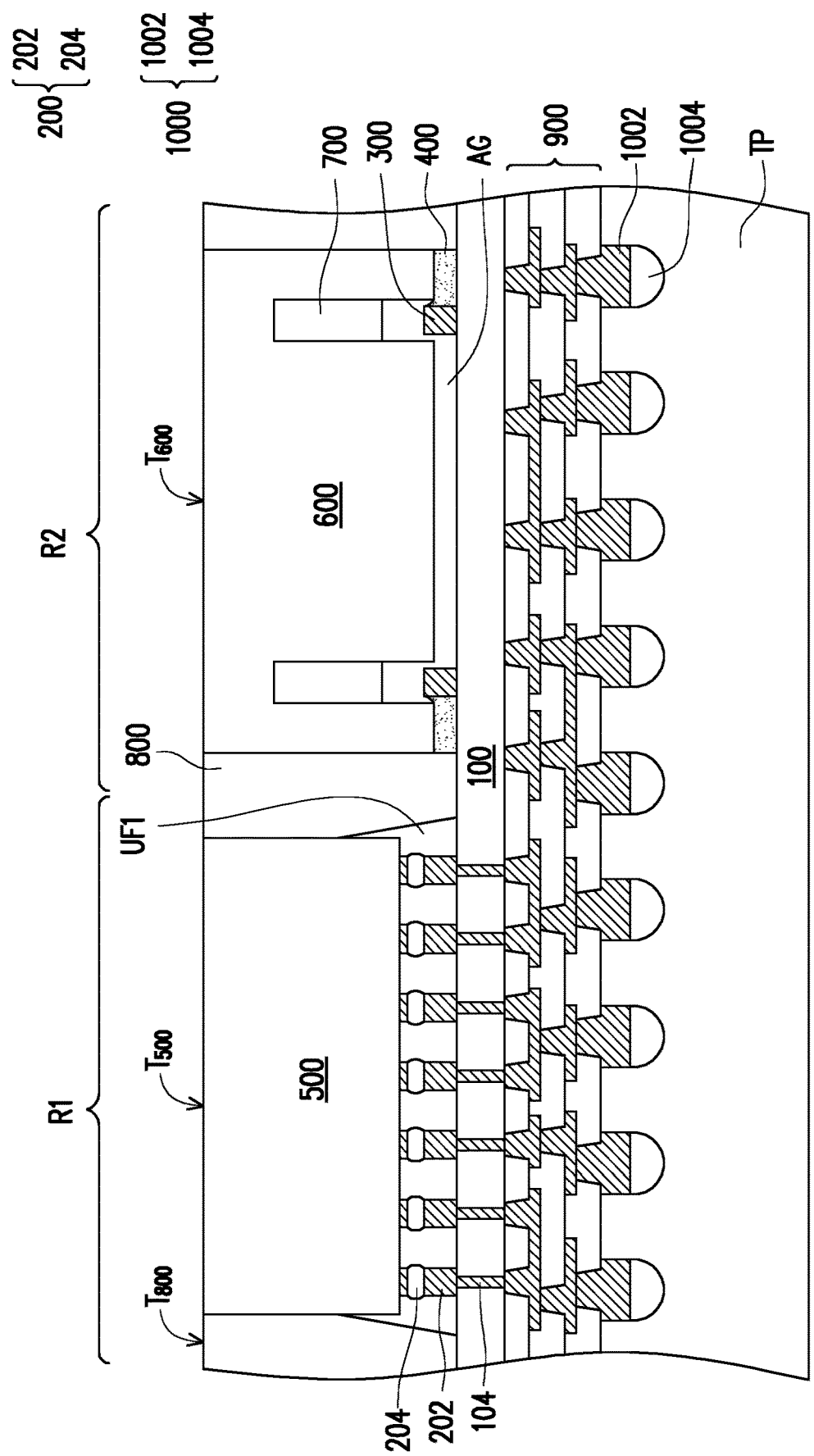
Figure 1L:
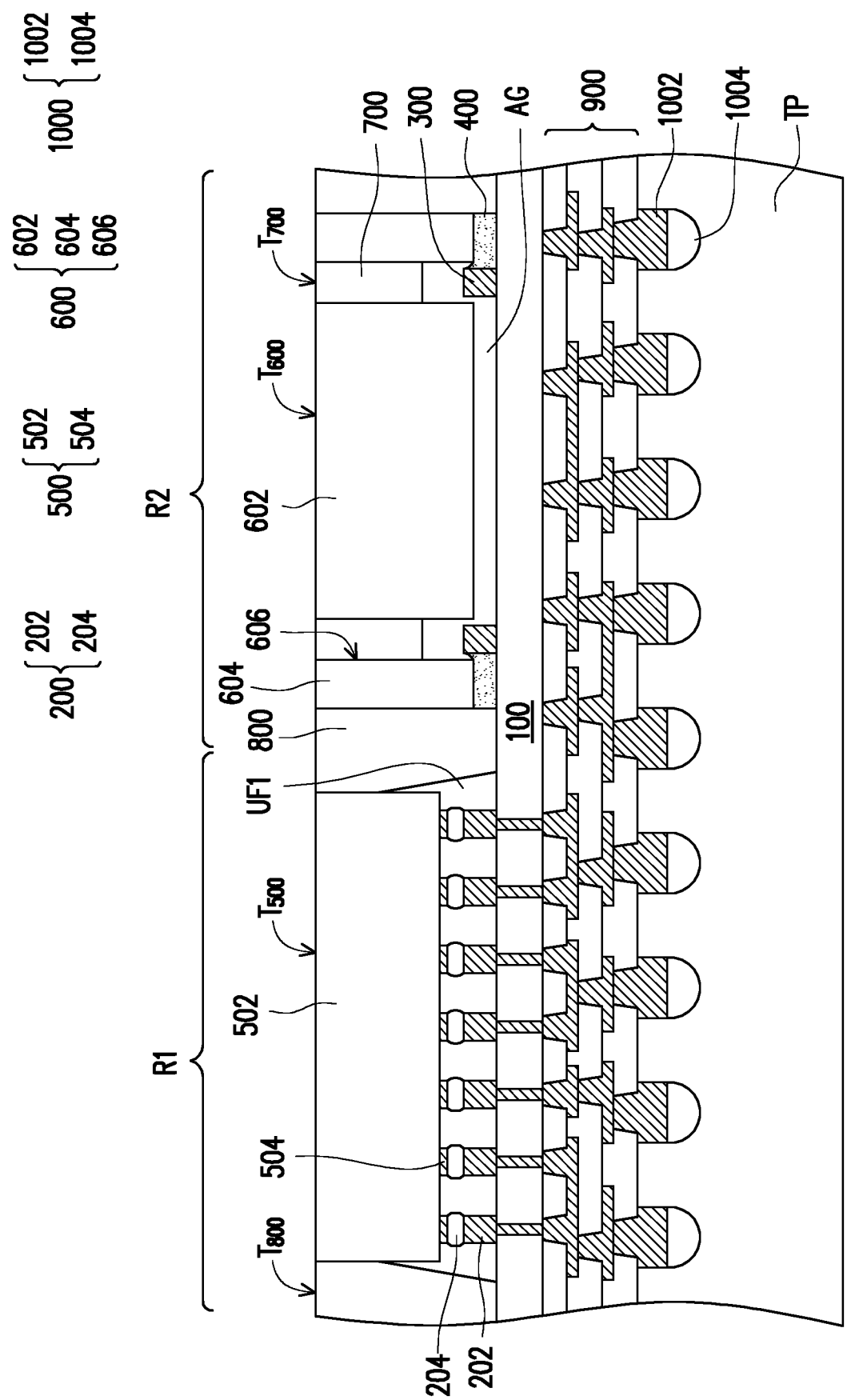
Figure 1M:
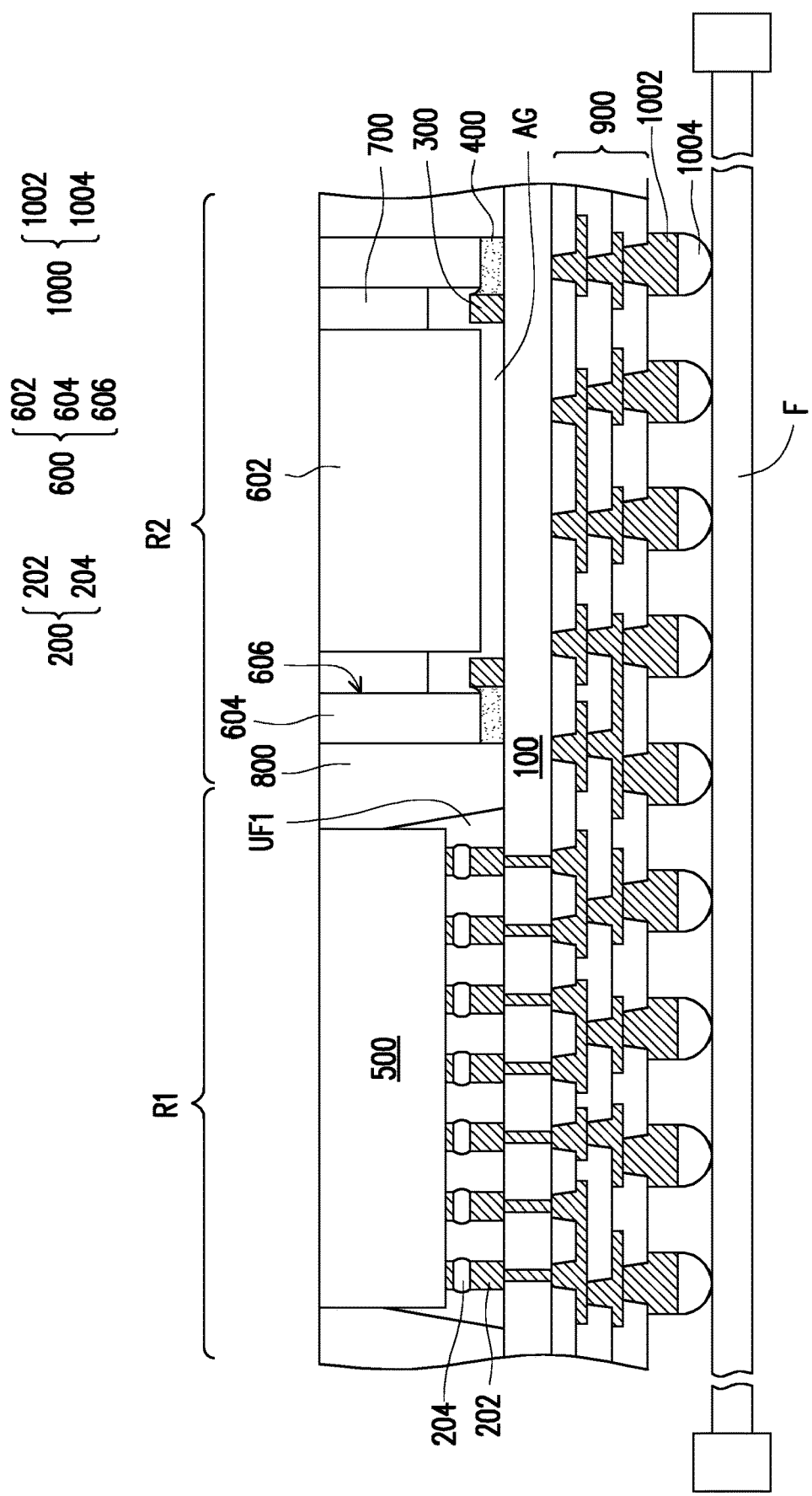
Figure 1N:
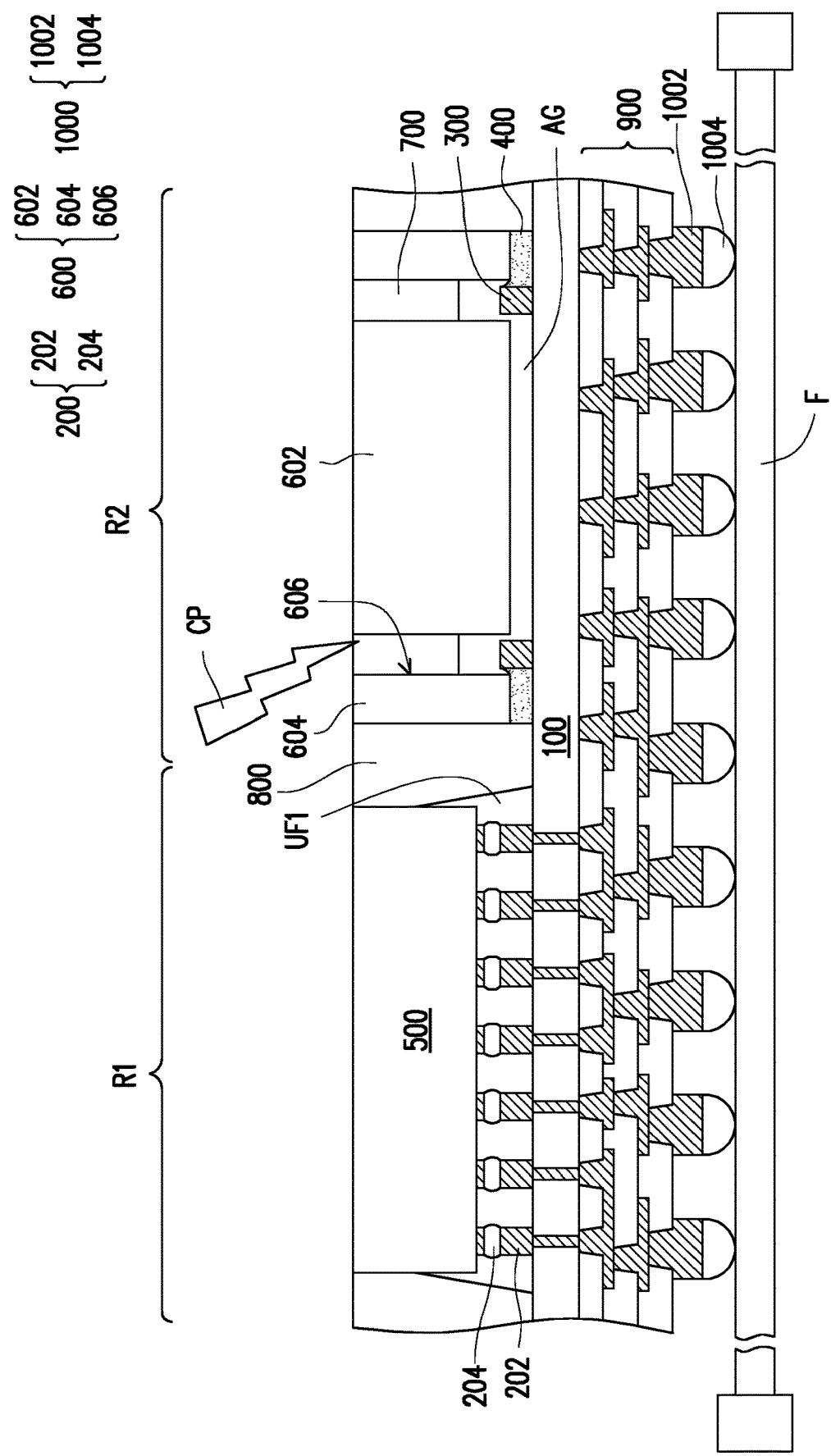
Figure 10:
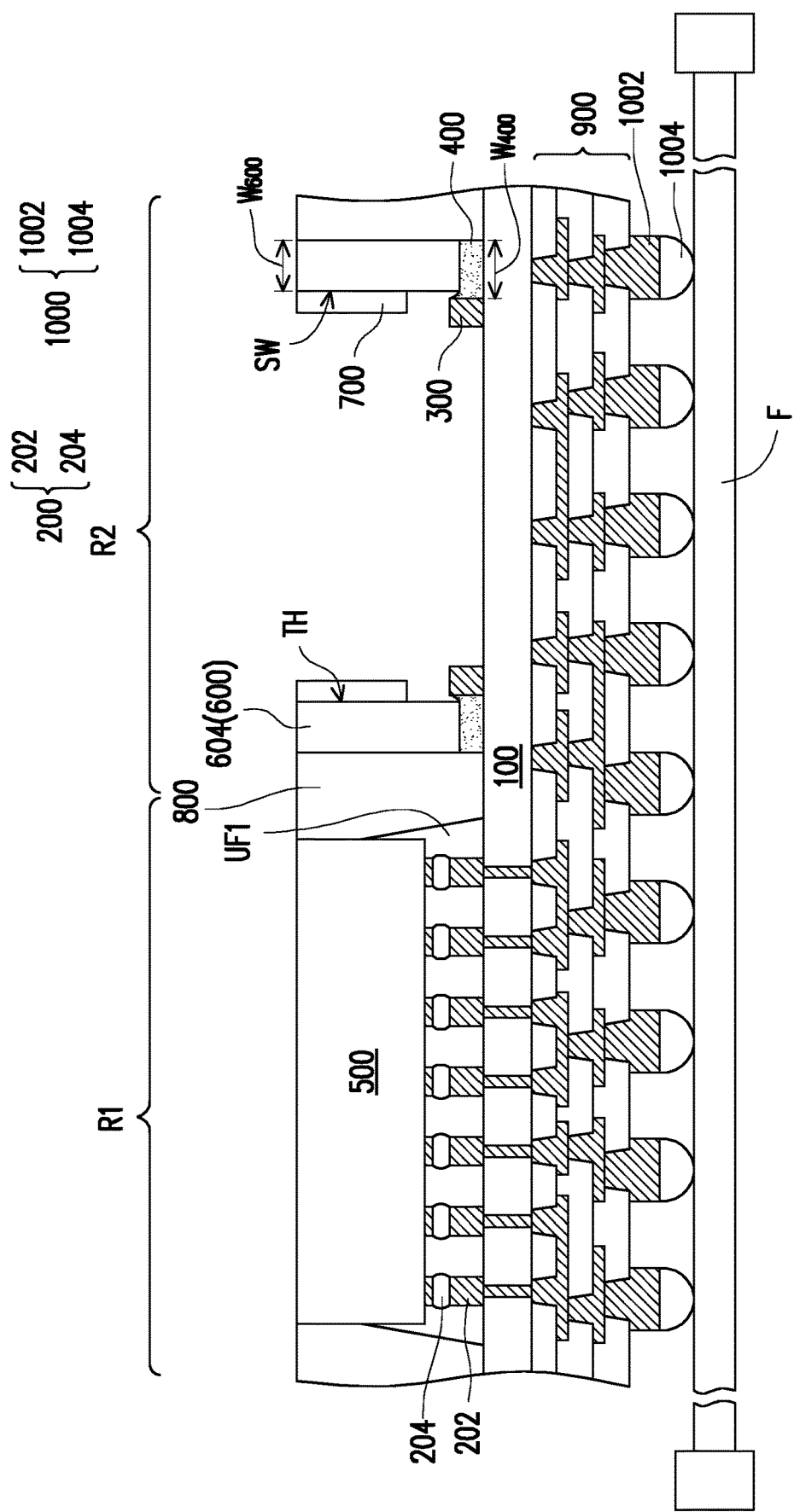
Figure 1P:
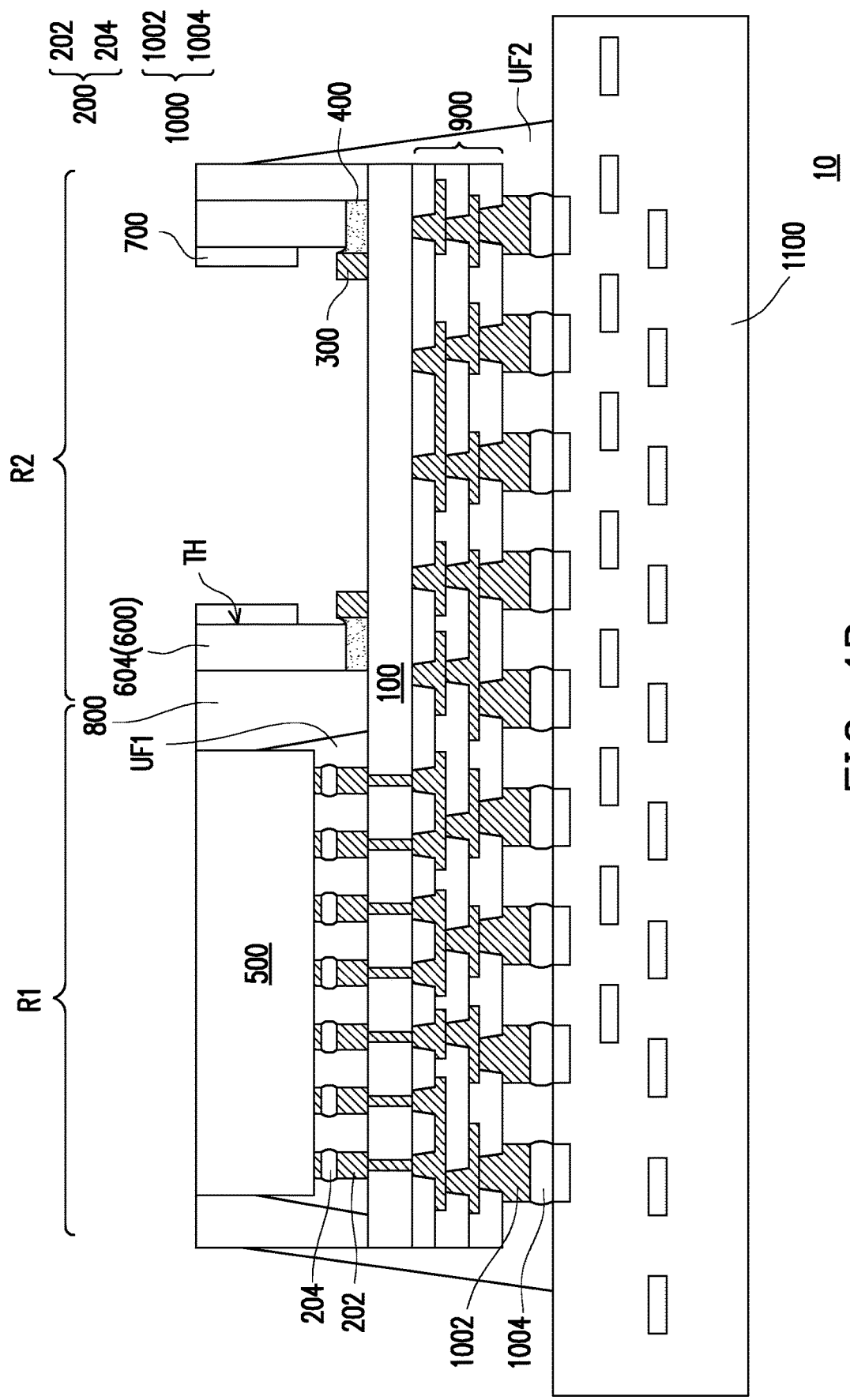

FIG. 1A to FIG. 1P are schematic cross-sectional views illustrating a manufacturing process of a package structure 10 in accordance with some embodiments of the disclosure. Referring to FIG. 1A, a first die 100 having a first region R1 and a second region R2 is provided. In some embodiments, the first region R1 is adjacent to the second region R2. For example, the first region R1 may be immediately adjacent to the second region R2. In some embodiments, the first die 100 includes a semiconductor substrate 102 and a plurality of through semiconductor vias (TSV) 104 embedded in the semiconductor substrate 102.

In some embodiments, the semiconductor substrate 102 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 102 has a plurality of semiconductor devices (e.g., transistors, capacitors, photodiodes, combinations thereof, or the like) and a plurality of optical devices (e.g. waveguides, filters, photodiodes, light-emitting diodes, combinations thereof, or the like) formed therein. In some embodiments, the semiconductor devices are formed in the first region R1 and the optical devices are formed in the second region R2. As such, the second region R2 of the first die 100 may be adapted to transmit/receive optical signals. However, the disclosure is not limited thereto. In some alternative embodiments, the semiconductor devices and the optical devices may be respectively formed in both of the first region R1 and the second region R2.

In some embodiments, the TSVs 104 are located within the first region R1. In other words, the second region R2 of the first die 100 is free of TSV. As illustrated in FIG. 1A, the depth of the TSVs 104 is smaller than the thickness of the semiconductor substrate 102. That is, at this stage, the TSVs 104 do not penetrate through the semiconductor substrate 102.

Referring to FIG. 1B, a plurality of connectors 200 and a dam structure 300 are formed over the first die 100. In some embodiments, the connectors 200 are formed in the first region R1. In some embodiments, each of the connectors 200 includes a conductive pillar 202 and a conductive bump 204 disposed on the conductive pillar 202. As illustrated in FIG. 1B, the conductive pillars 202 are disposed corresponding to the TSVs 104. In some embodiments, the connectors 200 are referred to as "micro bumps." In some embodiments, the connectors 200 may be formed by the following steps. First, a seed layer (not shown) is blanketly formed over the first die 100. The seed layer may be formed through, for example, a sputtering process, a physical vapor deposition (PVD) process, or the like. In some embodiments, the seed layer may include, for example, copper, titanium-copper alloy, or other suitable choice of materials. Subsequently, a photoresist pattern layer (not shown) is formed over the seed layer. The photoresist pattern layer has openings exposing portions of the seed layer. In some embodiments, locations of the exposed portions of the seed layer correspond to locations of the TSVs 104 of the first die 100. Thereafter, a conductive material (not shown) and a solder material (not shown) are sequentially deposited onto the exposed seed layer. That is, the conductive material and the solder material are located within the openings of the photoresist pattern layer. In some embodiments, the conductive material and the solder material may be formed by a plating process. The plating process is, for example, electroplating, electroless-plating, immersion plating, or the like. In some embodiments, the conductive material includes, for example, copper, copper alloys, or the like. After the conductive material and the solder material are formed, the photoresist pattern layer is removed. Upon removal of the photoresist pattern layer, portions of the seed layer, which are not covered by the conductive material and the solder material, are exposed. In some embodiments, the photoresist pattern layer may be removed/stripped through, for example, etching, ashing, or other suitable removal processes. Then, the seed layer that is not covered by the conductive material and the solder material is removed. The exposed portions of the seed layer may be removed through an etching process. In some embodiments, the remaining seed layer and the conductive material constitute the conductive pillars 202. Thereafter, a reflow process is performed on the solder material to transform the solder material into the conductive bumps 204.

In some embodiments, the dam structure 300 is formed in the second region R2. In some embodiments, the connectors 200 in the first region R1 and the dam structure 300 in the second region R2 may be formed simultaneously. For example, the conductive pillars 202 of the connectors 202 and the dam structure 300 may be formed by the same process step. That is, the conductive material and the seed layer formed in the first region R1 is referred to as the conductive pillars 202 and the conductive material and the seed layer formed in the second region R2 is referred to as the dam structure 300. As illustrated in FIG. 1B, the conductive bumps 204 do not form in the second region R2. However, the disclosure is not limited thereto. In some alternative embodiments, the conductive bumps 204 may be formed in both of the first region R1 and the second region R2, and the dam structure 300 is constituted by the conductive material, the seed layer, and the conductive bumps located in the second region R2. That is, the dam structure 300 may have the same geometry as that of the connectors 200 in the cross-sectional view. In some embodiments, a material of the dam structure 300 includes metal. For example, the dam structure 300 may be made of copper, copper alloy, titanium-copper alloy, solder, other suitable choice of materials, or a combination thereof.

Referring to FIG. 1C, an adhesive layer 400 is formed on the semiconductor substrate 102 of the first die 100. In some embodiments, the adhesive layer 400 is dispensed in the second region R2. In some embodiments, the adhesive layer 400 is a liquid-type adhesive layer. For example, the adhesive layer 400 includes a liquid-type die attach film (DAF) or a liquid-type film over wire (FOW). In some embodiments, the liquid-type adhesive layer has a viscosity lower than that of the conventional film-type adhesive layer. In some embodiments, the adhesive layer 400 is free of filler. Unlike the conventional film-type adhesive layer, the liquid-type adhesive layer may be formed in any desired pattern through dispending methods. For example, the adhesive layer 400 may be formed by screen printing, inkjet printing, three-dimensional printing, or the like. The configurations of the connectors 200, the dam structure 300, and the adhesive layer 400 will be discussed below in conjunction with FIG. 1C and FIG. 2.

Figure 2:
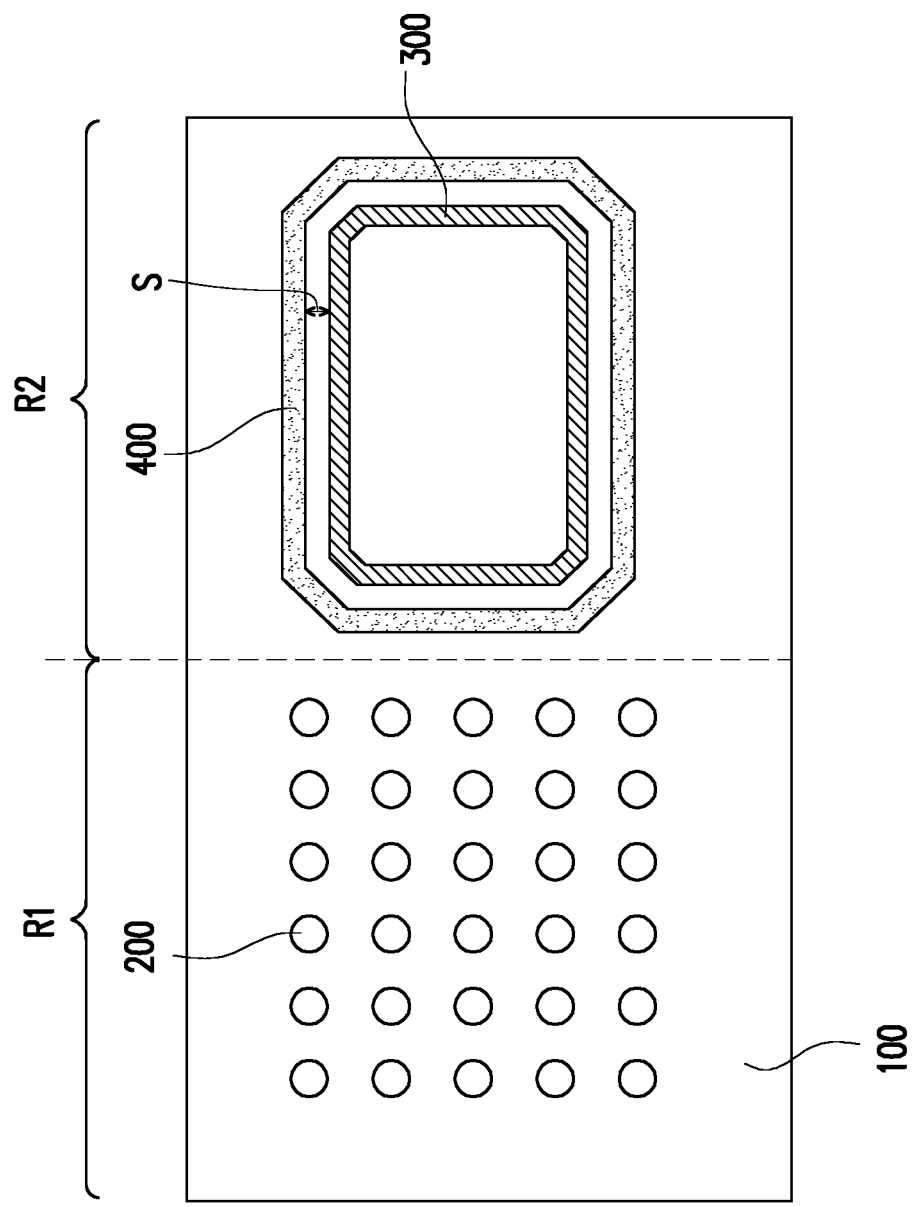
FIG. 2 is a schematic top view illustrating an intermediate stage of the manufacturing process of the package structure in FIG. 1C.

FIG. 2 is a schematic top view illustrating an intermediate stage of the manufacturing process of the package structure 10 in FIG. 1C. Referring to FIG. 1C and FIG. 2, the connectors 200 are located in the first region R1. In some embodiments, the connectors 200 are arranged in an array. On the other hand, the dam structure 300 and the adhesive layer 400 are ring-shaped. In some embodiments, the adhesive layer 400 is formed to encircle or surround the dam structure 300. In some embodiments, the dam structure 300 and the adhesive layer 400 are separated from each other. That is, a space S may be found between the ring-shaped dam structure 300 and the ring-shaped adhesive layer 400. In some embodiments, the dam structure 300 and the adhesive layer 400 may be concentric rings.

Referring to FIG. 1D, a second die 500 and a third die 600 are provided. In some embodiments, the second die 500 includes a semiconductor substrate 502 and a plurality of conductive pads 504. In some embodiments, the semiconductor substrate 502 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 502 may include active components (e.g., transistors or the like) and optionally passive components (e.g., resistors, capacitors, inductors or the like) formed therein. The conductive pads 504 are distributed over the semiconductor substrate 502. In some embodiments, the conductive pads 504 includes, for example, aluminum pads, copper pads, or other suitable metal pads.

Figure 3:
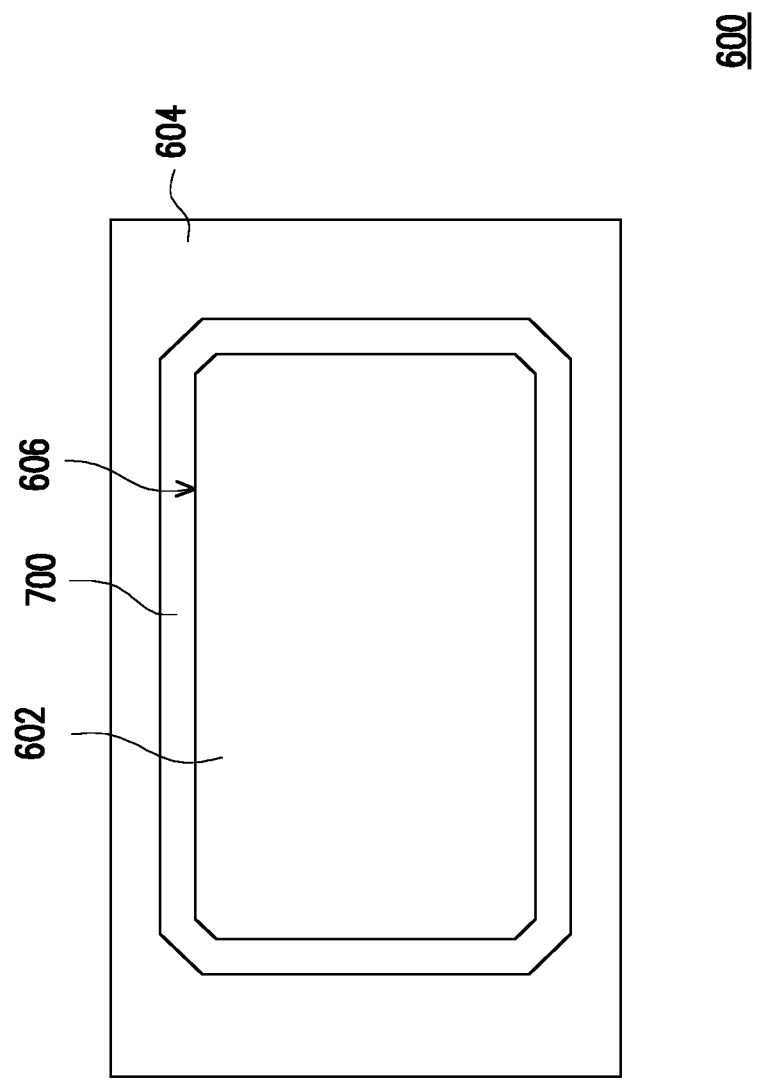
FIG. 3 is a schematic top view illustrating the third die in FIG. 1D.

The configurations of the third die 600 will be discussed below in conjunction with FIG. 1D and FIG. 3. Referring to FIG. 1D and FIG. 3, the third die 600 has an inner portion 602, an outer portion 606, and a trench 606 located between the inner portion 602 and the outer portion 604. In some embodiments, the third die 600 is a bulky semiconductor substrate having a trench 606 formed therein. In some embodiments, the trench 606 exhibits a ring shape from the top view. The trench 606 divides the semiconductor substrate into the inner portion 602 and the outer portion 604. As illustrated in FIG. 1D, a depth of the trench 606 is smaller than a thickness of the third die 600. That is, the trench 606 does not penetrate through the third die 600. Therefore, at this stage, the inner portion 602 and the outer portion 604 are connected to each other by the bottom portion of the semiconductor substrate. In some embodiments, the semiconductor substrate may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the third die 600 is a dummy die. For example, the third die 600 may be free of active components and passive components. Alternatively, the third die 600 may include active components and passive components with functions of these components being disabled.

In some embodiments, the trench 606 of the third die 600 is partially filled with a dielectric material 700. For example, the dielectric material 700 covers a bottom surface and a portion of sidewalls of the trench 606. On the other hand, another portion of the sidewalls of the trench 606 is not being covered by the dielectric material 700. In some embodiments, the dielectric material 700 includes polyimide, epoxy resin, acrylic resin, phenol resin, benzocyclobutene (BCB), polybenzooxazole (PBO), or any other suitable polymer-based dielectric materials.

Referring to FIG. 1E, the second die 500 and the third die 600 shown in FIG. 1D are placed on the first die 100 shown in FIG. 1C. In some embodiments, the second die 500 and the third die 600 may be placed through a pick-and-place process. In some embodiments, the second die 500 and the third die 600 are disposed side by side over the first die 100. For example, the second die 500 is placed in the first region R1 and the third die 600 is placed in the second region R2. It should be noted that since the first die 100 serves as a carrier for supporting the second die 500 and the third die 600, the first die 100 may be referred to as a "substrate" in some embodiments.

As illustrated in FIG. 1E, the second die 500 is placed such that the conductive pads 504 of the second die 500 are attached to the connectors 200. For example, each of conductive pads 504 is directly in contact with the corresponding conductive bump 204. After the second die 500 is placed on the connectors 200, a reflow process may be performed to fix the conductive pads 504 onto the conductive bumps 204. As such, electrical connection between the second die 500 and the first die 100 may be realized through the connectors 200. That is, the connectors 200 are disposed between the first die 100 and the second die 500, and the second die 500 is electrically connected to the first die 100 through the connectors 200. In some embodiments, an underfill layer UF1 is formed between the first die 100 and the second die 500. For example, the underfill layer UF1 may be formed to wrap around the connectors 202 and the conductive pads 504 to protect these elements. In some embodiments, the underfill layer UF1 may be optional.

In some embodiments, the third die 600 may be placed over the first die 100 through the following steps. First, the trench 606 of the third die 600 and the dam structure 300 are aligned. Thereafter, the third die 600 is being moved downward to fit the dam structure 300 into the trench 606 of the third die 600. That is, the dam structure 300 is inserted into the trench 606. Meanwhile, the outer portion 604 of the third die 600 is attached to the adhesive layer 400. In other words, the adhesive layer 400 is sandwiched between the first die 100 and the third die 600. By fitting the dam structure 300 into the trench 606 and by attaching the outer portion 604 of the third die 600 to the adhesive layer 400, the third die 600 may be temporarily fixed in position. Subsequently, the third die 600 is pressed against the adhesive layer 400 to ensure the outer portion 604 of the third die 600 is securely fixed onto the adhesive layer 400. Thereafter, the adhesive layer 400 is cured to strengthen the adhesion between the first die 100 and the outer portion 604 of the third die 600. As illustrated in FIG. 1E, the dielectric material 700 is spaced apart from the dam structure 300. On the other hand, an air gap AG is formed between the inner portion 602 of the third die 600 and the first die 100. For example, the region directly underneath the inner portion 602 of the third die 600 is free of adhesive layer. That is, the adhesive layer 400 is formed to correspond the shape of the outer portion 604 of the third die 600. As mentioned above, the liquid-type adhesive layer allows the formation of any desired pattern. Therefore, by adapting the liquid-type adhesive layer as a material of the adhesive layer 400, the adhesive layer 400 may be formed to correspond the shape of the outer portion 605 and the foregoing configuration may be easily attained.

In some embodiments, the adhesive layer 400 is a viscous fluid before curing. Since the third die 600 is being pressed against the adhesive layer 400 before curing, portions of the adhesive layer 400 would be squeezed laterally. For example, the adhesive layer 400 would flow toward the dam structure 300. As such, upon pressing the third die 600, the space S between the dam structure 300 and the adhesive layer 400 (shown in FIG. 1C and FIG. 2) would no longer exist and the adhesive layer 400 would be in contact with the dam structure 300. The geometry of the adhesive layer 400 will be discussed below in conjunction with FIG. 1E and FIG. 4A.

Figure 4A:
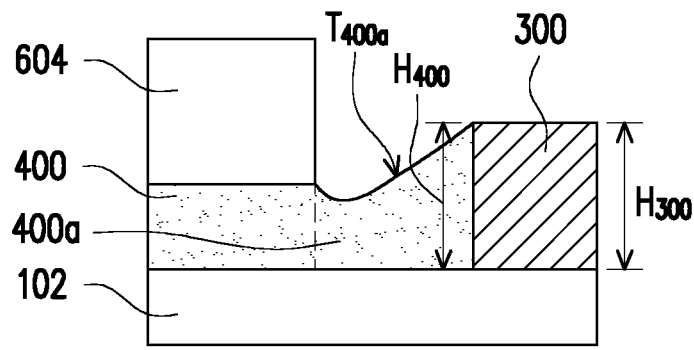
FIG. 4A is a schematic enlarged view illustrating a region in FIG. 1E in accordance with some embodiments of the disclosure.

FIG. 4A is a schematic enlarged view illustrating a region R in FIG. 1E in accordance with some embodiments of the disclosure. Referring to FIG. 1E and FIG. 4A, the adhesive layer 400 which flows laterally may be stopped by the dam structure 300. That is, the dam structure 300 not only serves as an alignment mark for aligning the first die 100 and the third die 600, but also functions as a barrier structure for stopping the flooding of the adhesive layer 400. For example, as illustrated in FIG. 4A, the flowing of the adhesive layer 400 towards the dam structure 300 is stopped by the dam structure 300. Due to the viscous nature of the adhesive layer 400, a sinking portion 400a may be formed in the adhesive layer 400 between the outer portion 604 of the third die 600 and the dam structure 300. In some embodiments, the sinking portion 400a of the adhesive layer 400 has a curved surface T400a. In some embodiments, the curved surface T400a is a concave surface, so the sinking portion 400a may be referred to as a "concave portion." In some embodiments, the curved surface T400a is located in the trench 606 of the third die 600. For example. The curve surface T400a is located between an edge of a top surface of the dam structure 300 and an edge of a bottom surface of the outer portion 604 of the third die 600. As illustrated in FIG. 4A, a maximum thickness $H_{400}$ of the adhesive layer 400 is substantially equal to a thickness $H_{300}$ of the dam structure 300. That is, the adhesive layer 400 completely covers a sidewall of the dam structure 300. On the other hand, the adhesive layer 400 does not cover sidewall of the trench 606 and sidewall of the outer portion 604. It should be noted that the configuration of the adhesive layer 400 shown in FIG. 4A merely serves as an exemplary illustration, and the disclosure is not limited thereto. Depending on the amount of the adhesive layer 400 dispensed in the step illustrated in FIG. 1C, the adhesive layer 400 in FIG. 1E may exhibit other geometries in some alternative embodiments. Other geometries of the adhesive layer 400 will be discussed below in conjunction with FIG. 4B and FIG. 4C.

Figure 4B:
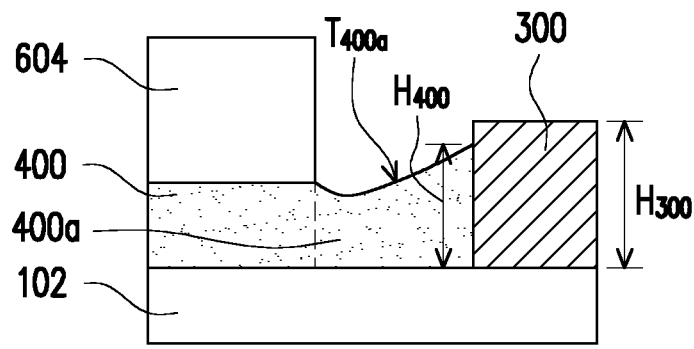
FIG. 4B is a schematic enlarged view illustrating a region in FIG. 1E in accordance with some alternative embodiments of the disclosure.

FIG. 4B is a schematic enlarged view illustrating a region in FIG. 1E in accordance with some alternative embodiments of the disclosure. Referring to FIG. 4B, when the amount of adhesive layer 400 dispensed is deficient, the flowing of the adhesive layer 400 may be easily stopped by the dam structure 300. It should be noted that the term "deficient" herein refers to a scenario where the amount of the adhesive layer 400 dispensed is less than that of in FIG. 4A while still being sufficient enough to securely fix the third die 300 on the first die 100. Due to the viscous nature of the adhesive layer 400, a sinking portion 400a may be formed in the adhesive layer 400 between the outer portion 604 of the third die 600 and the dam structure 300. In some embodiments, the sinking portion 400a of the adhesive layer 400 has a curved surface T400a. In some embodiments, the curved surface T400a is a concave surface, so the sinking portion 400a may be referred to as a "concave portion." In some embodiments, the curved surface T400a is located in the trench 606 of the third die 600. For example. The curve surface T400a is located between a sidewall of the dam structure 300 and an edge of a bottom surface of the outer portion 604 of the third die 600. As illustrated in FIG. 4A, a maximum thickness $H_{400}$ of the adhesive layer 400 is smaller than a thickness $H_{300}$ of the dam structure 300. That is, the adhesive layer 400 partially covers a sidewall of the dam structure 300. For example, at least a portion of the sidewall of the dam structure 300 is exposed. On the other hand, the adhesive layer 400 does not cover sidewall of the trench 606 and sidewall of the outer portion 604.

Figure 4C:
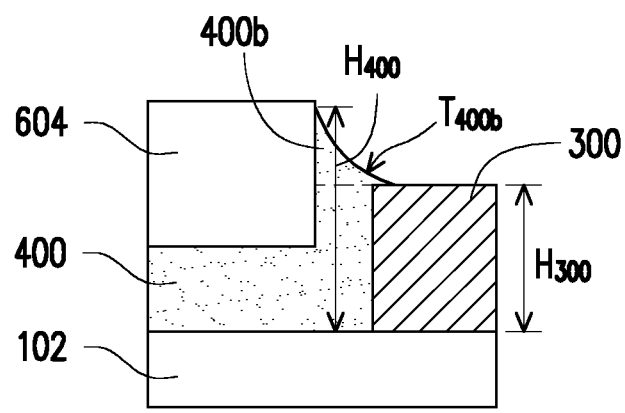
FIG. 4C is a schematic enlarged view illustrating a region in FIG. 1E in accordance with some alternative embodiments of the disclosure.

FIG. 4C is a schematic enlarged view illustrating a region in FIG. 1E in accordance with some alternative embodiments of the disclosure. Referring to FIG. 4C, when the amount of adhesive layer 400 dispensed is excessive, the flowing of the adhesive layer 400 towards the dam structure 300 cannot be stopped by the height of the dam structure 300. Therefore, the adhesive layer 40 would flood over a top surface of the dam structure 300 and an overflow portion 400b of the adhesive layer 400 is generated over the dam structure 300. It should be noted that the term "excessive" herein refers to a scenario where the amount of the adhesive layer 400 dispensed is more than that of in FIG. 4A. In some embodiments, the adhesive layer 400 completely covers a sidewall of the dam structure 300 and a maximum thickness $H_{400}$ of the adhesive layer 400 is greater than a thickness $H_{300}$ of the dam structure 300. It should be noted that although the flooding of the adhesive layer 400 cannot be stopped by the height of the dam structure 300, the top surface of the dam structure 300 may serve as a buffer region to prevent the adhesive layer 400 from flooding to another side of the dam structure 300. That is, the top surface of the dam structure 300 provides sufficient buffer area such that the overflow portion 400b of the adhesive layer 400 partially covers the top surface of the dam structure 300. In some embodiments, the overflow portion 400b of the adhesive layer 400 also partially covers a sidewall of the trench 606 and a sidewall of the outer portion 604.

In some embodiments, the overflow portion 400b of the adhesive layer 400 has a curved surface $T_{400b}$. In some embodiments, the curved surface $T_{400b}$ is a concave surface, so the overflow portion 400a may be referred to as a "concave portion." In some embodiments, the curved surface $T_{400b}$ is located in the trench 606 of the third die 600.

For example, the curved surface $T_{400b}$ is located between the sidewall of the trench 606 and the top surface of the dam structure 300.

Referring to FIG. 1F, after placing the second die 500 and the third die 600 on the first die 100, an encapsulation material 800a is formed on the first die 100 to encapsulate the second die 500 and the third die 600. In some embodiments, the encapsulation material 800a is a molding compound, a molding underfill, a resin (such as epoxy), or the like. In some embodiments, the encapsulation material 800a includes fillers. The fillers may be particles made of silica, aluminum dioxide, or the like. In some embodiments, the material of the encapsulation material 800a is different from the material of the adhesive layer 400. The encapsulation material 800a may be formed by a molding process, such as a compression molding process. In some embodiments, the second die 500 and the third die 600 are completely encapsulated by the encapsulation material 800a. For example, a top surface $T_{800a}$ of the encapsulation material 800a is located at a level height higher than a top surface $T_{500}$ of the second die 500 and a top surface $T_{600}$ of the third die 600. In other words, the second die 500 and the third die 600 are not revealed and are well protected by the encapsulation material 800a. As illustrated in FIG. 1F, the air gap AG and the trench 606 of the third die 600 are sealed by the outer portion 604 of the third die 600, the inner portion 602 of the third die 600, the adhesive layer 400, and the dam structure 300, so the encapsulation material 800a does not fill into the air gap AG and the trench 606 of the third die 600.

Referring to FIG. 1F and FIG. 1G, a portion of the encapsulation material 800a is removed to expose the top surface $T_{500}$ of the second die 500 and the top surface $T_{600}$ of the third die 600. In some embodiments, the portion of the encapsulation material 800a may be removed through a grinding process, such as a mechanical grinding process, a chemical mechanical polishing (CMP) process, or another suitable mechanism. After the encapsulation material 800a is grinded, an encapsulant 800 is formed over the first die 100 to laterally encapsulate the second die 500 and the third die 600. As illustrated in FIG. 1G, the a top surface $T_{800}$ of the encapsulant 800, the top surface $T_{500}$ of the second die 500, and the top surface $T_{600}$ of the third die 600 are substantially coplanar.

Referring to FIG. 1H, a carrier C having a de-bonding layer DB formed thereon is provided. In some embodiments, the de-bonding layer DB is formed on a top surface of the carrier C. The structure illustrated in FIG. 1G is flipped upside down and is placed on the carrier C. For example, the structure illustrated in FIG. 1G may be placed such that the top surface $T_{500}$ of the second die 500, the top surface $T_{600}$ of the third die 600, and the top surface $T_{800}$ of the encapsulant 800 are attached to the de-bonding layer DB. The carrier C is, for example, a glass substrate. In some embodiments, the de-bonding layer DB may be a light-to-heat conversion (LTHC) release layer formed on the glass substrate. In some alternative embodiments, the de-bonding layer DB may be a glue layer or a polymer-based buffer layer. However, the materials of the carrier C and the de-bonding layer DB listed above are merely exemplary illustration, and the disclosure is not limited thereto. In some alternative embodiments, other materials may be adapted as the carrier C as long as the said material is able to withstand the subsequent process while carrying/supporting the subsequently formed elements. Similarly, other materials may be adapted as the de-bonding layer DB as long as the material is able to perform the release function in the subsequent processes.

Referring to FIG. 1H and FIG. 1I, a planarization process is performed on a rear surface $R_{100}$ of the first die 100. In some embodiments, the planarization process includes a mechanical grinding process and/or a chemical mechanical polishing (CMP) process. In some embodiments, the semiconductor substrate 102 is planarized until the TSVs 104 are revealed. For example, after the planarization process, the TSVs 104 penetrate through the semiconductor substrate 102. The TSVs 104 allow electrical communication between the front side and the back side of the first die 100. In some embodiments, after the TSVs 104 are revealed, the first die 100 may be further grinded to reduce the overall thickness thereof.

Referring to FIG. 1J, a redistribution structure 900 and a plurality of conductive terminals 1000 are sequentially formed on the first die 100 opposite to the second die 500 and the third die 600. In some embodiments, the redistribution structure 900 is electrically connected to the first die 100 and the second die 500. On the other hand, the redistribution structure 900 is electrically insulated from the third die 600. In some embodiments, the redistribution structure 900 includes a plurality of dielectric layers 902 and a plurality of redistribution conductive layers 904 stacked alternately. In some embodiments, the redistribution conductive layers 904 are electrically connected to the TSVs 104 of the first die 100. For example, the TSVs 104 are in contact with the bottommost redistribution conductive layer 904 of the redistribution structure 900. In some embodiments, a material of the redistribution conductive layers 904 includes aluminum, titanium, copper, nickel, tungsten, and/or alloys thereof. The redistribution conductive layers 904 may be formed by, for example, electroplating, deposition, and/or photolithography and etching. In some embodiments, a material of the dielectric layers 902 includes polyimide, epoxy resin, acrylic resin, phenol resin, benzocyclobutene (BCB), polybenzooxazole (PBO), or other suitable polymer-based dielectric materials. The dielectric layers 902, for example, may be formed by suitable fabrication techniques such as spin-on coating, chemical vapor deposition (CVD), plasma-enhanced chemical vapor deposition (PECVD), or the like.

In some embodiments, each of the conductive terminals 1000 includes a conductive pillar 1002 and a conductive bump 1004 disposed on the conductive pillar 1002. In some embodiments, the conductive terminals 1000 are referred to as "controlled collapse chip connection (C4) bumps." In some embodiments, the conductive terminals 1000 may be formed by the following steps. First, a seed layer (not shown) is formed over the topmost dielectric layer 902. The seed layer extends into the openings of the topmost dielectric layer 902 to be in contact with the topmost redistribution conductive layer 904. The seed layer may be formed through, for example, a sputtering process, a physical vapor deposition (PVD) process, or the like. In some embodiments, the seed layer may include, for example, copper, titanium-copper alloy, or other suitable choice of materials. Subsequently, a photoresist pattern layer (not shown) having a plurality of openings is formed over the seed layer. The openings of the photoresist pattern layer expose the seed layer located in the openings of the topmost dielectric layer 902 and expose at least a portion of the seed layer located on the topmost dielectric layer 902. Thereafter, a conductive material (not shown) and a solder material (not shown) are sequentially deposited onto the exposed seed layer. That is, the conductive material and the solder material are located within openings of the photoresist pattern layer. In some embodiments, the conductive material and the solder material may be formed by a plating process. The plating process is, for example, electro-plating, electroless-plating, immersion plating, or the like. In some embodiments, the conductive material includes, for example, copper, copper alloys, or the like. After the conductive material and the solder material are formed, the photoresist pattern layer is removed. Upon removal of the photoresist pattern layer, portions of the seed layer, which are not covered by the conductive material and the solder material, are exposed. In some embodiments, the photoresist pattern layer may be removed/stripped through, for example, etching, ashing, or other suitable removal processes. Then, the seed layer that is not covered by the conductive material and the solder material is removed. The exposed portions of the seed layer may be removed through an etching process. In some embodiments, the remaining seed layer and the conductive material constitute the conductive pillars 1002. Thereafter, a reflow process is performed on the solder material to transform the solder material into the conductive bumps 1004.

Referring to FIG. 1J and FIG. 1K, the structure illustrated in FIG. 1J is flipped upside down and is placed on a tape TP. Subsequently, the carrier C and the de-bonding layer DB are removed from the second die 500, the third die 600, and the encapsulant 800. In some embodiments, the de-bonding layer DB (e.g., the LTHC release layer) may be irradiated by an UV laser such that the carrier C and the de-bonding layer DB may be peeled off from the second die 500, the third die 600, and the encapsulant 800. However, the de-bonding process is not limited thereto. Other suitable de-carrier methods may be used in some alternative embodiments.

Referring to FIG. 1K and FIG. 1L, a thickness of the second die 500, a thickness of the third die 600, and a thickness of the encapsulant 800 are reduced. In some embodiments, the encapsulant 800, the second die 500, and the third die 600 are grinded until the dielectric material 700 filled in the trench 606 of the third die 600 is revealed. That is, a portion of the encapsulant 800, a portion of the second die 500, and a portion of the third 600 are removed. In some embodiments, the grinding process may include a mechanical grinding process, a chemical mechanical polishing (CMP) process, or another suitable mechanism. In some embodiments, after the dielectric material 700 is revealed, the second die 500, the third die 600, the encapsulant 800, and the dielectric material 700 may be further grinded to reduce the overall thickness of the subsequently formed package structure. After the grinding process, a top surface $T_{700}$ of the dielectric material 700, the top surface $T_{800}$ of the encapsulant 800, the top surface $T_{500}$ of the second die 500, and the top surface $T_{600}$ of the third die 600 are substantially coplanar. On the other hand, the trench 606 penetrate through the third die 600. As illustrated in FIG. 1L, at this stage, the inner portion 602 and the outer portion 604 of the third die 600 are spaced apart from each other. For example, the dielectric material 700 is sandwiched between the inner portion 602 and the outer portion 604 of the third die 600 to separate these two elements.

Referring to FIG. 1L and FIG. 1M, the tape TP is removed and the structure illustrated in FIG. 1L is mounted on a frame structure F for further processing. For example, a cleaning process may be performed to remove impurities or residues derived from the previous process steps.

Referring to FIG. 1N, a cutting process CP is performed on the exposed dielectric material 700. In some embodiments, the cutting process CP may include a laser drilling process, a mechanical drilling process, a combination thereof, or any other suitable dicing processes. In some embodiments, a portion of the dielectric material 700 is removed during the cutting process CP. For example, the dielectric material 700 may be cut through such that a portion of the dielectric material 700 remains on the sidewalls of the outer portion 604 while another portion of the dielectric material 700 remains on the sidewalls of the inner portion 602. After the cutting process CP, the inner portion 602 and the outer portion 604 are disconnected from each other.

Referring to FIG. 1O, the inner portion 602 and the portion of the dielectric material 700 remains on the sidewalls of the inner portion 602 are removed to form a through hole TH in the third die 600. As mentioned above, the region directly underneath the inner portion 602 includes the air gap AG and is free of adhesive layer. As such, the liquid-type adhesive layer 400 is able to securely fix the outer portion 604 of the third die 600 while allowing the inner portion 602 of the third die 600 to be easily removed. In some embodiments, since the inner portion 602 is removed and the outer portion 604 remains, the outer portion 604 may be referred to as the third die 600 hereinafter. As mentioned above, the third die 600 may be a dummy die. Therefore, in some embodiments, the third die 600 is electrically floating. As illustrated in FIG. 1O, the through hole TH of the third die 600 exposes portions of the second region R2 of the first die 100. For example, the optical devices formed in the second region R2 of the first die 100 may be exposed by the through hole TH. In some embodiments, the remaining dielectric material 700 partially covers sidewalls SW of the through hole TH. As illustrated in FIG. 1O, the dam structure 300 and the concave portion (the sinking portion 400a in FIGS. 4A-4B and the overflow portion 400b in FIG. 4C) are located in the through hole TH of the third die 300. Referring to FIG. 1N and FIG. 1O, since the through hole TH is obtained by removing the inner portion 602 and portions of the dielectric material 700 located in the trench 606, the sidewalls SW of the through hole TH correspond to the sidewall of the trench 606. Therefore, in some embodiments (for example, the embodiment corresponding to FIG. 4C), the concave portion (the overflow portion 400b in FIG. 4C) partially covers sidewalls SW of the through hole TH and the top surface of the dam structure 300. As illustrated in FIG. 1O, a width $W_{400}$ of the adhesive layer 400 is greater than a width $W_{600}$ of third die 600. However, the disclosure is not limited thereto. In some alternative embodiments, the width $W_{400}$ of the adhesive layer 400 may be substantially equal to or smaller than the width $W_{600}$ of the third die 600.

Referring to FIG. 1P, the frame structure F is removed and a singulation process is performed on the structure illustrated in FIG. 1O. In some embodiments, the dicing process or the singulation process typically involves dicing with a rotating blade or a laser beam. In other words, the dicing or singulation process is, for example, a laser cutting process, a mechanical cutting process, or other suitable processes. Thereafter, the singulated structure is placed on a substrate 1100 to obtain the package structure 10. In some embodiments, the substrate 1100 may include a printed circuit board (PCB) or the like. In some embodiments, an underfill layer UF2 may be optionally formed on the substrate 1100 to protect the redistribution structure 900 and the conductive terminals 1000. In some embodiments, the package structure 10 illustrated in FIG. 1P may be referred to as a "CoWoS (Chip on Wafer on Substrate) package." That is, in some embodiments, the first die 100 may serve as an interposer. However, the disclosure is not limited thereto. In some alternative embodiments, the process steps illustrated in FIG. 1A to FIG. 1P may be adapted to fabricate other type of packages, such as integrated fan-out (InFO) packages or the like.

Figure 5:
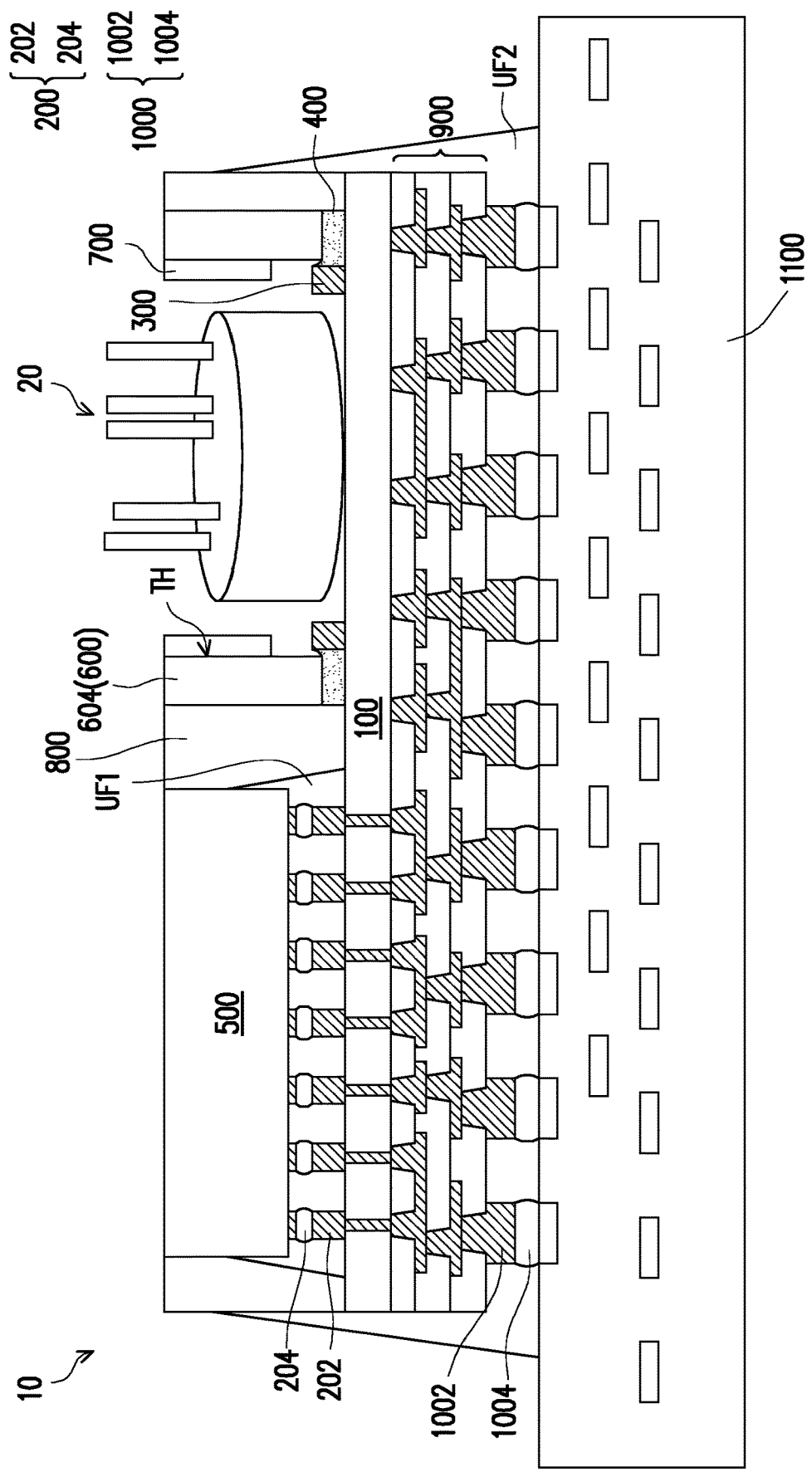
FIG. 5 is a schematic cross-sectional view illustrating an application of the package structure in FIG. 1P in accordance with some embodiments of the disclosure.

In some embodiments, by removing the inner portion 604 of the third die 600 to form the through hole TH, other photonic devices may be placed in the through hole TH for photonic applications. FIG. 5 is a schematic cross-sectional view illustrating an application of the package structure 10 in FIG. 1P in accordance with some embodiments of the disclosure. Referring to FIG. 5, a photonic device 20 is inserted into the through hole TH of the third die 600. That is, the through hole TH may serve as a socket. The photonic device 20 includes, for example, an optical fiber, a laser emitter, or the like. As mentioned above, the through hole TH exposes the optical device embedded in the first die 100. As such, upon inserting into the through hole TH, the photonic device 20 is able to optically communicate with the optical devices in the first die 100, thereby achieving photonic applications.

In accordance with some embodiments of the disclosure, a package structure includes a substrate, a die, an adhesive layer, a dam structure, and an encapsulant. The die is disposed on the substrate. The adhesive layer is disposed between the substrate and the die. The adhesive layer has a curved surface. The dam structure is disposed on the substrate and surrounded by the adhesive layer. The encapsulant encapsulates the die.

In accordance with some alternative embodiments of the disclosure, a package structure includes a first die, a second die, a third die, an adhesive layer, a dam structure, and an encapsulant. The second die and the third die are disposed side by side over the first die. The third die has a through hole exposing the first die. The adhesive layer is sandwiched between the third die and the first die. The adhesive layer includes a concave portion located in the through hole. The dam structure is disposed on the first die and located in the through hole. The encapsulant encapsulates the second die and the third die.

In accordance with some embodiments of the disclosure, a manufacturing method of a package structure includes at least the following steps. A first die having a first region and a second region adjacent to the first region is provided. A dam structure is formed in the second region. An adhesive layer is dispensed in the second region. The adhesive layer surrounds the dam structure. A second die is placed in the first region and a third die is placed in the second region. The third die has an inner portion, an outer portion, and a trench located between the inner portion and the outer portion. The trench is partially filled with a dielectric material. The second die and the third die are encapsulated by an encapsulant. A thickness of the third die is reduced to reveal the dielectric material filled in the trench of the third die. The inner portion of the third die is removed to expose the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a substrate;
   a die disposed on the substrate;
   an adhesive layer disposed between the substrate and the die, wherein the adhesive layer has a curved surface;
   a dam structure disposed on the substrate and surrounded by the adhesive layer; and
   an encapsulant encapsulating the die.

2. The package structure according to claim 1, wherein the adhesive layer comprises a liquid-type die attach film (DAF) or a liquid-type film over wire (FOW).

3. The package structure according to claim 1, wherein the adhesive layer is free of filler.

4. The package structure according to claim 1, wherein the adhesive layer has a sinking portion, and a surface of the sinking portion is the curved surface.

5. The package structure according to claim 4, wherein a maximum thickness of the adhesive layer is smaller than or substantially equal to a thickness of the dam structure.

6. The package structure according to claim 1, wherein the adhesive layer has an overflow portion partially covers sidewalls of the die and a top surface of the dam structure, and a surface of the overflow portion is the curved surface.

7. The package structure according to claim 6, wherein a maximum thickness of the adhesive layer is greater than a thickness of the dam structure.

8. A package structure, comprising:
   a first die;
   a second die and a third die disposed side by side over the first die, wherein the third die has a through hole exposing the first die;
   an adhesive layer sandwiched between the third die and the first die, wherein the adhesive layer comprises a concave portion located in the through hole;
   a dam structure disposed on the first die and located in the through hole; and
   an encapsulant encapsulating the second die and the third die.

9. The package structure according to claim 8, further comprising:
   a redistribution structure located on the first die opposite to the second die and the third die; and
   a plurality of conductive terminals over the redistribution structure.

10. The package structure according to claim 8, further comprising a plurality of connectors disposed between the second die and the first die, and the second die is electrically connected to the first die through the plurality of connectors.

11. The package structure according to claim 8, further comprising a dielectric material partially covering sidewalls of the through hole.

12. The package structure according to claim 8, wherein the third die is electrically floating.

13. The package structure according to claim 8, wherein the concave portion partially covers sidewalls of the through hole and a top surface of the dam structure.

14. The package structure according to claim 8, wherein the dam structure comprises metal.

15. A package structure, comprising:
   a substrate;
   a die disposed on the substrate, wherein the die is electrically floating;
   an adhesive layer disposed between the substrate and the die, wherein the adhesive layer has a curved surface;
   a dam structure disposed on the substrate and surrounded by the adhesive layer; and
   an encapsulant encapsulating the die.

16. The package structure according to claim 15, wherein the adhesive layer is free of filler.

17. The package structure according to claim 15, wherein the adhesive layer has a sinking portion, and a surface of the sinking portion is the curved surface.

18. The package structure according to claim 17, wherein a maximum thickness of the adhesive layer is smaller than or substantially equal to a thickness of the dam structure.

19. The package structure according to claim 15, wherein the adhesive layer has an overflow portion partially covers sidewalls of the die and a top surface of the dam structure, and a surface of the overflow portion is the curved surface.

20. The package structure according to claim 19, wherein a maximum thickness of the adhesive layer is greater than a thickness of the dam structure.

* * * * *